(12) United States Patent
Pan et al.

(10) Patent No.: US 12,461,454 B2
(45) Date of Patent: Nov. 4, 2025

(54) SEMICONDUCTOR PROCESSING TOOL AND METHOD OF USING THE SAME

(71) Applicant: Taiwan Semiconductor Manufacturing Company, Ltd., Hsinchu (TW)

(72) Inventors: Tzu-Jung Pan, Hsinchu (TW); Sheng-Kang Yu, Hsinchu (TW); Shang-Chieh Chien, New Taipei (TW); Heng-Hsin Liu, New Taipei (TW); Li-Jui Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 872 days.

(21) Appl. No.: 17/652,169

(22) Filed: Feb. 23, 2022

(65) Prior Publication Data

US 2022/0404722 A1    Dec. 22, 2022

Related U.S. Application Data

(60) Provisional application No. 63/202,615, filed on Jun. 17, 2021.

(51) Int. Cl.
*G03F 7/20* (2006.01)
*G03F 7/00* (2006.01)
*H05G 2/00* (2006.01)

(52) U.S. Cl.
CPC ...... *G03F 7/70916* (2013.01); *G03F 7/70033* (2013.01); *H05G 2/0094* (2024.08)

(58) Field of Classification Search
CPC ............ G03F 7/70916; G03F 7/70033; G03F 7/70175; G03F 7/7085; G03F 7/70933; H05G 2/005
See application file for complete search history.

(56) References Cited

U.S. PATENT DOCUMENTS

| | | | |
|---|---|---|---|
| 2011/0204249 A1* | 8/2011 | Nagai | H05G 2/005 250/504 R |
| 2019/0155179 A1* | 5/2019 | Wu | G03F 7/70175 |
| 2021/0033981 A1* | 2/2021 | Takashima | H05G 2/005 |

* cited by examiner

*Primary Examiner* — Mesfin T Asfaw
(74) *Attorney, Agent, or Firm* — Harrity & Harrity, LLP

(57) ABSTRACT

A plurality of hydrogen outlets are arrayed along a direction normal to a surface (such as a surface of a collector) of an extreme ultraviolet lithography (EUV) tool to increase a volume of hydrogen gas surrounding the surface. As a result, airborne tin is more likely to be stopped by the hydrogen gas surrounding the surface and less likely to bind to the surface. Fewer tin deposits results in increased lifetime for the surface, which reduces downtime for the EUV tool. Additionally, a control device may receive (e.g., from a camera and/or another type of sensor) an indication of levels of tin contamination on the surface and control flow rates to adjust a thickness of the hydrogen curtain. As a result, tin contamination on the collector is less likely to occur and will be more efficiently cleaned by the hydrogen gas, which results in increased lifetime for the surface and reduced downtime for the EUV tool.

20 Claims, 17 Drawing Sheets

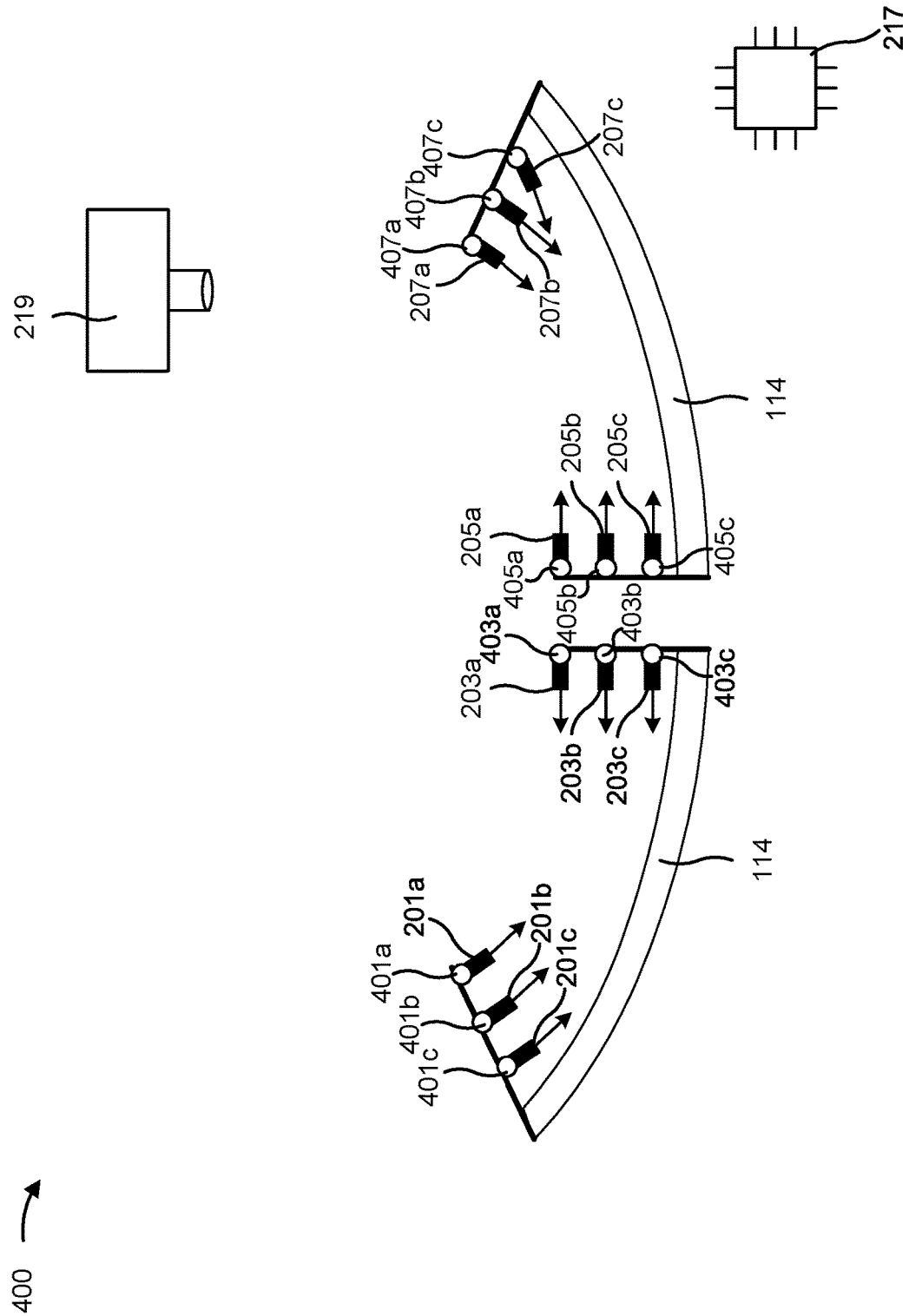

SEMICONDUCTOR PROCESSING TOOL AND METHOD OF USING THE SAME

CROSS-REFERENCE TO RELATED APPLICATION

This Patent Application claims priority to U.S. Provisional Patent Application No. 63/202,615, filed on Jun. 17, 2021, and entitled "HYDROGEN FLOW TECHNIQUES FOR EXTREME ULTRAVIOLET LITHOGRAPHY." The disclosure of the prior Application is considered part of and is incorporated by reference into this Patent Application.

BACKGROUND

As semiconductor device sizes continue to shrink, some lithography technologies suffer from optical restrictions, which lead to resolution issues and reduced lithography performance. In comparison, extreme ultraviolet (EUV) lithography can achieve much smaller semiconductor device sizes and/or feature sizes through the use of reflective optics and radiation wavelengths of approximately 13.5 nanometers or less.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4D are diagrams of an example implementation described herein.

DETAILED DESCRIPTION

Figure 1:
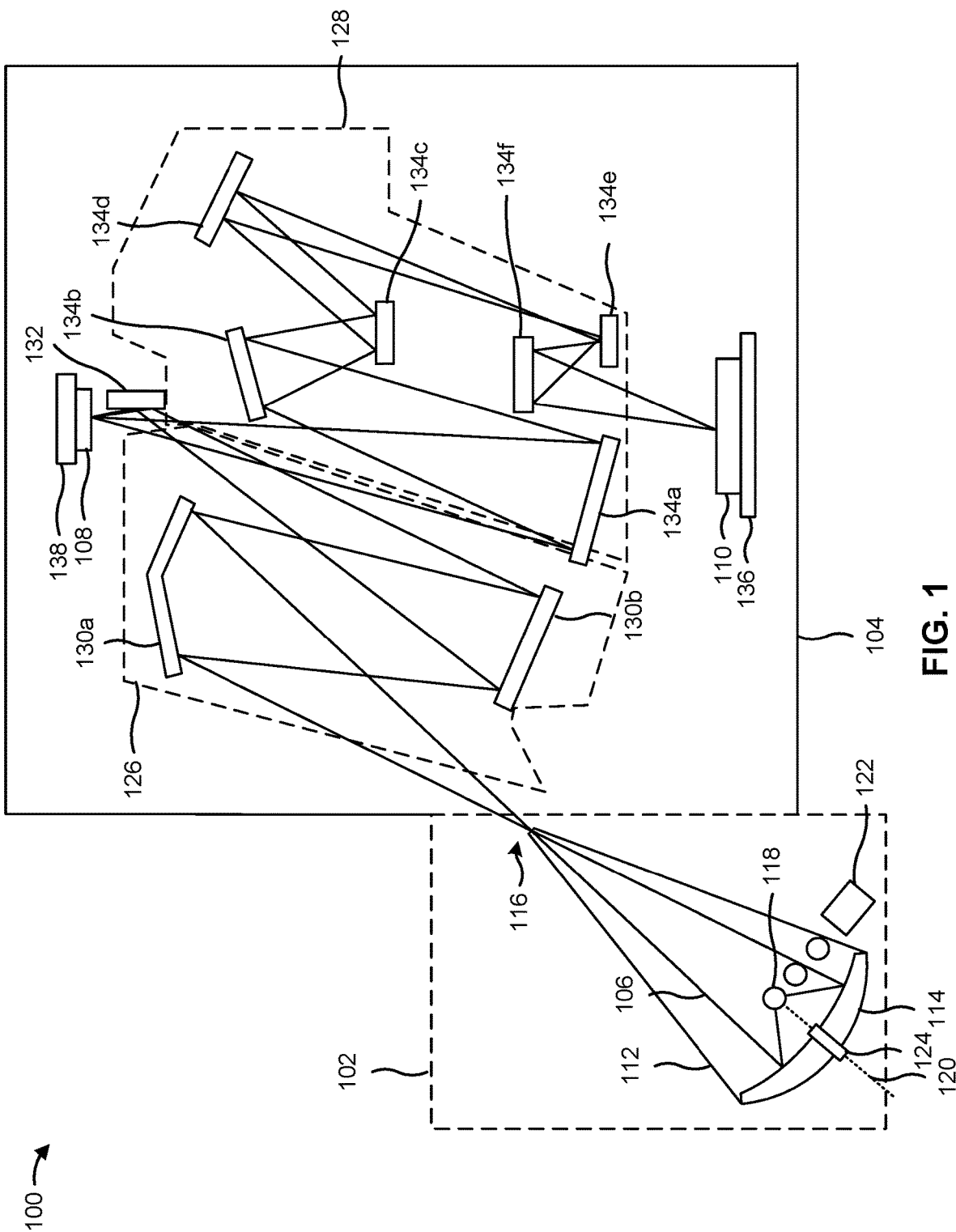
FIG. 1 is a diagram of an example extreme ultraviolet (EUV) lithography semiconductor processing tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During an extreme ultraviolet (EUV) lithography process, a photoresist material is exposed to EUV radiation within an exposure tool during patterning of a wafer or other semiconductor structure. In order to generate the EUV radiation, tin droplets are suspended in a vacuum environment and are excited by one or more lasers at a primary focus (PF) of a collector. The EUV radiation generated by the tin droplets is then collected by the collector and directed by an intermediate focus (IF) toward the wafer.

The excitation process causes some tin particles to break away from the droplets and become airborne. This airborne tin can bind to components of an EUV system, such as the collector. The tin particles reduce reflectivity of the collector, which degrades performance of the EUV system and eventually can render the EUV system non-functional. When the collector reflectivity is too low, the collector is replaced, which results in downtime for the EUV system and reduces throughput for wafers.

In order to help prevent tin from binding to the collector, a hydrogen ($H_2$) flow system provides hydrogen gas near the collector. The hydrogen gas provides a hydrogen curtain that decelerates the tin particles and helps prevent the tin from depositing on the collector. Additionally, the hydrogen gas produces hydrogen radical, which can bind to tin that is on the reflector to form stannane, which is subsequently removed with one or more pumps, such as turbo molecular pumps (TMPs). However, some tin still binds to the collector and is not cleaned by the hydrogen gas, which still results in decreased reflectivity of the collector and eventual downtime for the EUV system.

Some implementations described herein provide techniques and apparatuses for using a plurality of hydrogen outlets that are arrayed along a direction normal to a surface (such as a surface of a collector) of an EUV tool. By using the plurality of hydrogen outlets that are arrayed along the direction normal to the surface, a volume of hydrogen gas surrounding the surface is increased. As a result, airborne tin is more likely to be stopped by the hydrogen gas surrounding the surface and less likely to bind to the surface. Fewer tin deposits results in increased lifetime for the surface, which therefore reduces downtime for the EUV tool.

Additionally, a control device may receive (e.g., from a camera and/or another type of sensor) an indication of levels of tin contamination on the surface. Accordingly, the control device controls flow rates associated with the plurality of hydrogen outlets to adjust a thickness of the hydrogen curtain. For example, the control device may provide higher flow rates towards portions of the surface associated with higher levels of tin contamination. As a result, tin contamination on the surface is less likely to occur and will be cleaned more efficiently by the hydrogen gas, which results in further increased lifetime for the surface and reduced downtime for the EUV tool. The control device may further control the flow rates and thickness of the hydrogen curtain iteratively. For example, the control device may receive (e.g., periodically) updated indications of levels of tin contamination on the surface and therefore adjust the flow rates based on the updated indications.

FIG. 1 is a diagram of an example lithography system 100 described herein. The lithography system 100 includes an EUV lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1, the lithography system 100 includes a radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV scanner or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 (e.g., tin (Sn) droplets or another type of droplets) being exposed to a laser beam 120. The droplets 118 are provided across the front of the collector 114 by a droplet generator (DG) head 122. The DG head 122 is pressurized to provide a fine and controlled output of the droplets 118.

A laser source, such as a pulse carbon dioxide ($CO_2$) laser, generates the laser beam 120. The laser beam 120 is provided (e.g., by a beam delivery system to a focus lens) such that the laser beam 120 is focused through a window 124 of the collector 114. The laser beam 120 is focused onto the droplets 118 which generates the plasma. The plasma produces a plasma emission, some of which is the radiation 106. The laser 120 is pulsed at a timing that is synchronized with the flow of the droplets 118 from the DG head 122.

The exposure tool 104 includes an illuminator 126 and a projection optics box (POB) 128. The illuminator 126 includes a plurality of reflective mirrors that are configured to focus and/or direct the radiation 106 onto the reticle 108 so as to illuminate the pattern on the reticle 108. The plurality of mirrors include, for example, a mirror 130a and a mirror 130b. The mirror 130a includes a field facet mirror (FFM) or another type of mirror that includes a plurality of field facets. The mirror 130b includes a pupil facet mirror (PFM) or another type of mirror that also includes a plurality of pupil facets. The facets of the mirrors 130a and 130b are arranged to focus, polarize, and/or otherwise tune the radiation 106 from the radiation source 102 to increase the uniformity of the radiation 106 and/or to increase particular types of radiation components (e.g., transverse electric (TE) polarized radiation, transverse magnetic (TM) polarized radiation). Another mirror 132 (e.g., a relay mirror) is included to direct radiation 106 from the illuminator 126 onto the reticle 108.

The projection optics box 128 includes a plurality of mirrors that are configured to project the radiation 106 onto the semiconductor substrate 110 after the radiation 106 is modified based on the pattern of the reticle 108. The plurality of reflective mirrors include, for example, mirrors 134a-134f. In some implementations, the mirrors 134a-134f are configured to focus or reduce the radiation 106 into an exposure field, which may include one or more die areas on the semiconductor substrate 110.

The exposure tool 104 includes a substrate stage 136 (e.g., a wafer stage) configured to support the semiconductor substrate 110. Moreover, the substrate stage 136 is configured to move (or step) the semiconductor substrate 110 through a plurality of exposure fields as the radiation 106 transfers the pattern from the reticle 108 onto the semiconductor substrate 110. The exposure tool 104 also includes a reticle stage 138 that configured to support and/or secure the reticle 108. Moreover, the reticle stage 138 is configured to move or slide the reticle through the radiation 106 such that the reticle 108 is scanned by the radiation 106. In this way, a pattern that is larger than the field or beam of the radiation 106 may be transferred to the semiconductor substrate 110.

In an example exposure operation (e.g., an EUV exposure operation), the DG head 122 provides the stream of the droplets 118 across the front of the collector 114. The laser beam 120 contacts the droplets 118, which causes a plasma to be generated. The plasma emits or produces the radiation 106 (e.g., EUV light). The radiation 106 is collected by the collector 114 and directed out of the vessel 112 and into the exposure tool 104 toward the mirror 130a of the illuminator 126. The mirror 130a reflects the radiation 106 onto the mirror 130b, which reflects the radiation 106 onto the mirror 132 toward the reticle 108. The radiation 106 is modified by the pattern in the reticle 108. In other words, the radiation 106 reflects off of the reticle 108 based on the pattern of the reticle 108. The reflective reticle 108 directs the radiation 106 toward the mirror 134a in the projection optics box 128, which reflects the radiation 106 onto the mirror 134b. The radiation 106 continues to be reflected and reduced in the projection optics box 128 by the mirrors 134c-134f. The mirror 134f reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

As indicated above, FIG. 1 is provided as an example. Other examples may differ from what is described with regard to FIG. 1.

Figure 2A:
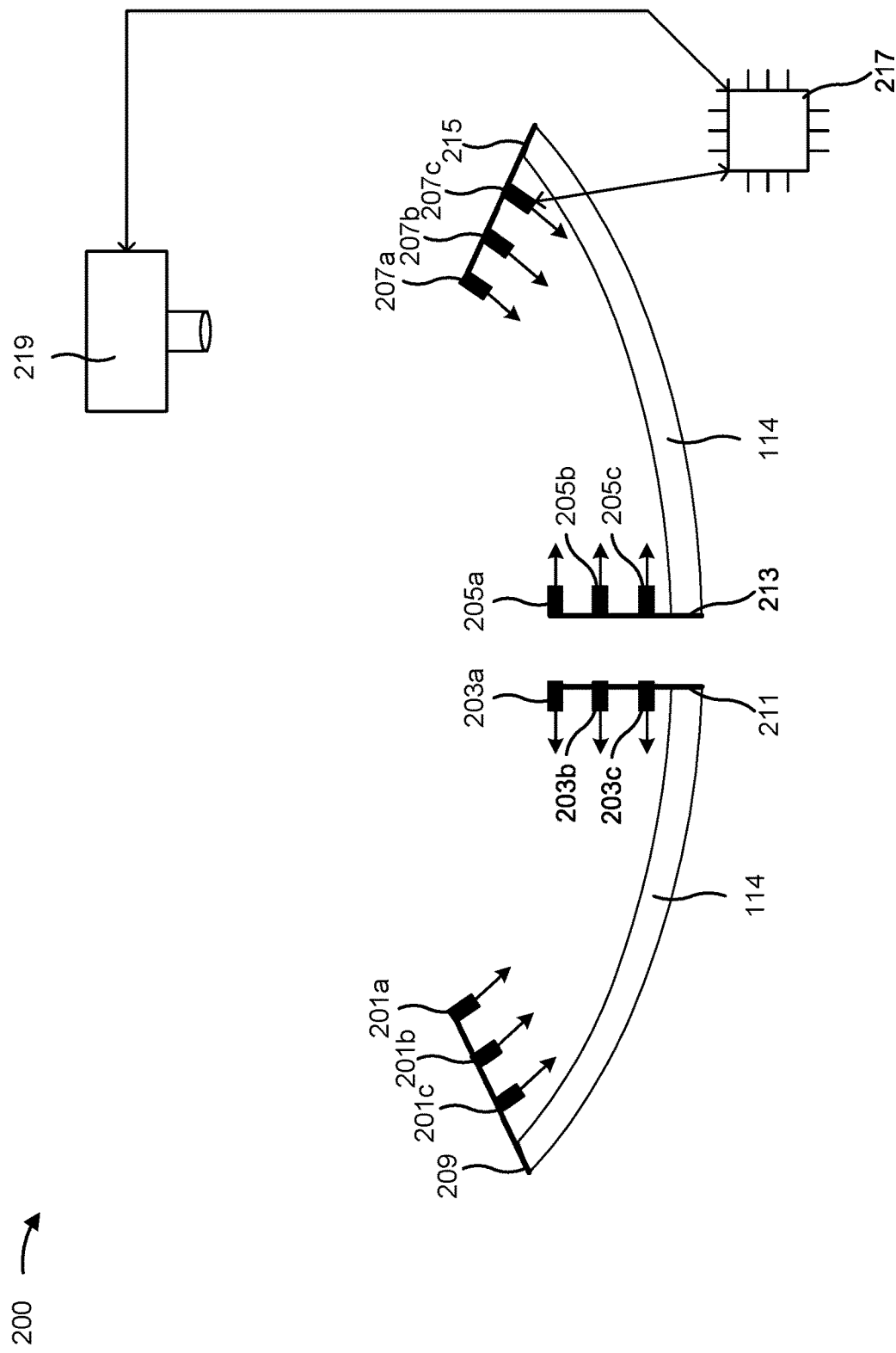
FIGS. 2A and 2B are diagrams of an example cleaning component described herein for use in the EUV semiconductor processing tool of FIG. 1.
Figure 2B:
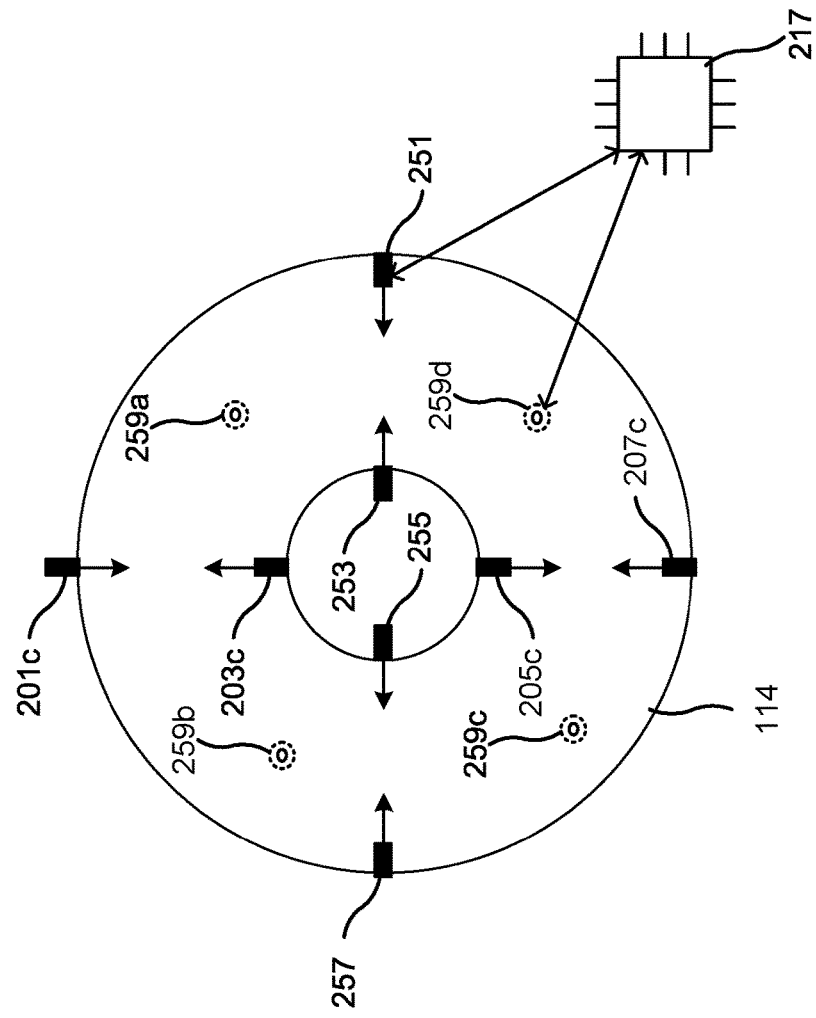

FIGS. 2A and 2B are diagrams of an example 200 of components within an EUV exposure tool (e.g., an EUV lithography system). As shown in FIG. 2A, example 200 includes a collector 114 with a plurality of hydrogen nozzles (e.g., nozzle 201a, nozzle 201b, nozzle 201c, nozzle 203a, nozzle 203b, nozzle 203c, nozzle 205a, nozzle 205b, nozzle 205c, nozzle 207a, nozzle 207b, and nozzle 207c) attached to the collector 114 via one or more supports (e.g., support 209, support 211, support 213, and support 215), a control device 217, and an optical sensor 219. These devices are described in more detail in connection with FIG. 1 and FIG. 6.

As described in connection with FIG. 1, the collector 114 may include one or more mirrors configured to collect the radiation generated by a radiation source and to focus the radiation toward an intermediate focus. In order to protect the collector 114, the plurality of hydrogen nozzles may be configured to provide a hydrogen curtain between the collector 114 and one or more tin droplets (e.g., droplet 118). Each nozzle may include a metal, plastic, or other solid material that is shaped to direct hydrogen gas from a storage mechanism, such as one or more hydrogen tanks, toward a volume between the collector 114 and the tin droplet(s). Each nozzle may thus be an outlet for hydrogen gas associated with a corresponding flow rate that is adjustable.

As shown in FIG. 2A, the plurality of hydrogen nozzles 201 are arrayed along a direction normal to the collector 114. For example, the plurality of hydrogen nozzles 201 may be attached to a support 209, which includes a metal, plastic, or other solid material that mounts the plurality of hydrogen nozzles 201 to the collector 114 or to a same structure that supports the collector 114 in the EUV exposure tool. Moreover, the plurality of hydrogen nozzles 203, which are spaced apart from the plurality of hydrogen nozzles 201 along a direction that follows a surface of the collector 114, are also arrayed along a direction normal to the collector 114. For example, the plurality of hydrogen nozzles 203 may be attached to a support 211, which includes a metal, plastic, or other solid material that mounts the plurality of hydrogen nozzles 203 to the collector 114 or to a same structure that supports the collector 114 in the EUV exposure tool.

Similarly, in example 200, the plurality of hydrogen nozzles 205 are arrayed along a direction normal to the collector 114, and the plurality of hydrogen nozzles 207, which are spaced apart from the plurality of hydrogen outlets 205 along a direction that follows a surface of the collector 114, are also arrayed along a direction normal to the collector 114. For example, the plurality of hydrogen nozzles 205 may be attached to a support 213, which includes a metal, plastic, or other solid material that mounts the plurality of hydrogen nozzles 205 to the collector 114 or to a same structure that supports the collector 114 in the EUV exposure tool. Similarly, the plurality of hydrogen nozzles 207 may be attached to a support 215, which includes a metal, plastic, or other solid material that mounts the plurality of hydrogen nozzles 201 to the collector 114 or to a same structure that supports the collector 114 in the EUV exposure tool.

FIG. 2A depicts twelve nozzles; however, other implementations may include additional nozzles or fewer nozzles. Using additional nozzles provides additional protection to the collector 114 from airborne tin particles, which further reduces downtime of the EUV exposure tool. Using fewer nozzles reduces a chance of disrupting the tin droplets with hydrogen gas; more stable tin droplets results in higher power output from the EUV exposure tool and can help reduce processing time for wafers (e.g., semiconductor substrate 110). Additionally, using fewer nozzles reduces manufacturing materials and time consumed for producing the EUV exposure tool. FIG. 2A depicts four nozzle groups arrayed along a direction that follows a surface of the collector 114 and three nozzles in each nozzle group arrayed along a direction normal to the collector 114; however, other implementations may include differently arranged nozzles, such as a different quantity of nozzle groups and/or different quantities of nozzles in different nozzle groups, among other examples. For example, additional nozzles arrayed along a direction normal to the collector 114 in nozzle groups near an exterior circumference of the collector 114 may be used to steer the tin droplets over the collector 114, which increases power output from the EUV exposure tool and can help reduce processing time for wafers (e.g., semiconductor substrate 110). In another example, additional nozzles arrayed along a direction normal to the collector 114 in nozzle groups near an interior circumference of the collector 114 may be used to protect portions of the collector 114 that are more likely to receive EUV radiation, which increases power output from the EUV exposure tool and can help reduce processing time for wafers (e.g., semiconductor substrate 110).

As further shown in FIG. 2A, a control device 217 may receive status information from the pluralities of nozzles 201, 203, 205, and/or 207 and may provide commands to the pluralities of nozzles 201, 203, 205, and/or 207 to independently control flow rates associated with the pluralities of nozzles 201, 203, 205, and/or 207. Controlling the flow rates independently allows the control device 217 to increase the flow rates of some nozzles independently of other nozzles (e.g., across nozzle groups or within a nozzle group) and/or to decrease the flow rates of some nozzles independently of other nozzles (e.g., across nozzle groups or within a nozzle group). By controlling the flow rates independently, the control device 217 can increase a volume of a hydrogen curtain, formed by output from the nozzles, near portions of the collector 114 associated with higher tin contamination. As a result, the increased hydrogen curtain helps protect those portions of the collector 114 from additional airborne tin particles and reduces the tin contamination by increasing a quantity of radical hydrogen that can bind to the tin contamination and form stannane that is removed (e.g., by one or more TMPs and/or one or more other pumps that maintain a vacuum environment around the collector 114).

In some implementations, and as shown in FIG. 2A, at least one optical sensor (e.g., optical sensor 219) captures one or more images including the collector 114. The optical sensor 219 may include a camera, such as a charge-coupled device (CCD) camera, or another type of optical sensor. The optical sensor 219 may communicate with the control device 217 to receive commands to capture the one or more images and to transmit the one or more images to the control device 217. Accordingly, the control device 217 may identify levels of tin contamination associated with the collector 114 using the one or more images. For example, the control device 217 may use an object detection algorithm (e.g., a neural network and/or other model that identifies tin deposits within the one or more images), a color and/or brightness algorithm (e.g., to identify tin deposits within the one or more images based on darker portions and/or differently colored portions of the image(s)), and/or another type of model to determine a distribution of tin on the collector 114. Although described with the control device 217 identifying levels of tin contamination associated with the collector 114, other implementations may use the optical sensor 219 to identify the levels of tin contamination and transmit an indication of the levels to the control device 217. Using the optical sensor 219 to determine a distribution of tin on the collector 114 conserves power and processing resources at the control device 217 while using the control device 217 to determine a distribution of tin on the collector 114 conserves power and processing resources at the optical sensor 219.

Accordingly, the control device 217 may control the flow rates based on an indication of levels of tin contamination associated with the collector 114. For example, as described in connection with FIGS. 3A-3D, the control device 217 may provide commands to increase one or more flow rates associated with one or more nozzles near higher levels of tin contamination. The control device 217 may use an equation and/or another formula that accepts data indicating the tin contamination levels as input and outputs data indicating the flow rates to use.

In some implementations, the control device 217 is configured to use a machine learning model, which is trained based on historical data, to control the flow rates. For example, the machine learning model may correlate historical changes in tin contamination (e.g., across different images from the optical sensor 219 over time) with historical flow rates associated with the plurality of hydrogen nozzles. Other parameters used by the model may include make/model information associated with the nozzles, shapes associated with the nozzles, positions of the nozzles, and/or hydrogen output distributions associated with the nozzles, among other examples. For a combination of flow rates and/or parameters, the machine learning model may have been trained to estimate flow rates that result in changes to levels of tin contamination. Accordingly, the machine learning model may accept the difference between the levels of tin contamination and the desired levels of tin contamination and output data indicating the flow rates for the control device 217 to use.

The control device 217 may control the flow rates subject to a maximum total flow rate. For example, as described above, the nozzles may use hydrogen from a storage mechanism such that the total flow rate cannot exceed a threshold based on capabilities of the storage mechanism. Additionally, or alternatively, the total flow rate may be subject to a threshold such that the storage mechanism does not run out of hydrogen before completion of a current processing step for a wafer or a current cycle that includes a sequence of processing steps for multiple wafers. Accordingly, the control device 217 may increase one or more flow rates associated with one or more of the nozzles and decrease one or more flow rates associated with one or more others of the nozzles. The increase and decrease may correspond such that the total flow rate associated with the nozzles does not exceed the maximum total flow rate. In implementations where the control device 217 uses a machine learning model, the machine learning model may be subject to the maximum total flow rate as a constraint.

FIG. 2B is a diagram of a top down view of example 200. FIG. 2B shows additional nozzles 251, 253, 255, and 257 not shown in FIG. 2A. Nozzles 251 and 257 may be associated with an exterior circumference of the collector 114 and may be spaced apart along a direction that follows a surface of the collector 114. Similarly, nozzles 253 and 255 may be associated with an interior circumference of the collector 114 and may be spaced apart along a direction that follows a surface of the collector 114. Additional nozzles arrayed along a direction normal to the collector 114 may be included above nozzle 251, nozzle 253, nozzle 255, and/or nozzle 257.

As shown in FIG. 2B, example 200 may include, in addition to or in lieu of the optical sensor 219, one or more pressure sensors (e.g., pressure sensors 259a, 259b, 259c, and 259d). Each pressure sensor may include a piezoelectric sensor, a capacitive sensor, and/or another type of pressure sensor. The pressure sensors 259a, 259b, 259c, and 259d may communicate with the control device 217 to receive commands to capture measurements associated with the collector 114 and to transmit the measurements to the control device 217. Accordingly, the control device 217 may identify levels of tin contamination associated with the collector 114 using the one or more measurements. For example, the control device 217 may use an object detection algorithm (e.g., a neural network and/or other model that identifies changes in measurements consistent with the presence of tin deposits) and/or another type of model to determine a distribution of tin on the collector 114. Although described with the control device 217 identifying levels of tin contamination associated with the collector 114, other implementations may use the pressure sensors 259a, 259b, 259c, and/or 259d to identify the levels of tin contamination and transmit an indication of the levels to the control device 217. Using the pressure sensors 259a, 259b, 259c, and/or 259d to determine a distribution of tin on the collector 114 conserves power and processing resources at the control device 217 while using the control device 217 to determine a distribution of tin on the collector 114 conserves power and processing resources at the pressure sensors 259a, 259b, 259c, and/or 259d.

Although described using the collector 114, example 200 may be applied to other surfaces in the EUV exposure tool. For example, the plurality of hydrogen nozzles shown in FIGS. 2A and 2B may be used to protect and clean other mirrors in the EUV exposure tool (e.g., one or more of mirrors 134a-134f), the reticle 108, and/or one or more mirrors associated with the wafer stage 136.

As indicated above, FIGS. 2A and 2B are provided as examples. Other examples may differ from what is described with regard to FIGS. 2A and 2B. The number and arrangement of devices shown in FIGS. 2A and 2B are provided as examples. In practice, there may be additional devices, fewer devices, different devices, or differently arranged devices than those shown in FIGS. 2A and 2B. Furthermore, two or more devices shown in FIGS. 2A and 2B may be implemented within a single device, or a single device shown in FIGS. 2A and 2B may be implemented as multiple, distributed devices. Additionally, or alternatively, a set of devices (e.g., one or more devices) shown in FIGS. 2A and 2B may perform one or more functions described as being performed by another set of devices shown in FIGS. 2A and 2B.

FIGS. 3A-3D are diagrams of an example implementation 300 associated with cleaning surfaces (e.g., collector 114) within an EUV exposure tool (e.g., an EUV lithography system). Example implementation 300 includes a collector 114 with a plurality of hydrogen nozzles (e.g., nozzle 201a, nozzle 201b, nozzle 201c, nozzle 203a, nozzle 203b, nozzle 203c, nozzle 205a, nozzle 205b, nozzle 205c, nozzle 207a, nozzle 207b, and nozzle 207c) attached to the collector 114 via one or more supports (e.g., support 209, support 211, support 213, and support 215), a control device 217, and an optical sensor 219. These devices are described in more detail in connection with FIGS. 1, 2A, 2B, and/or 6.

Figure 3A:
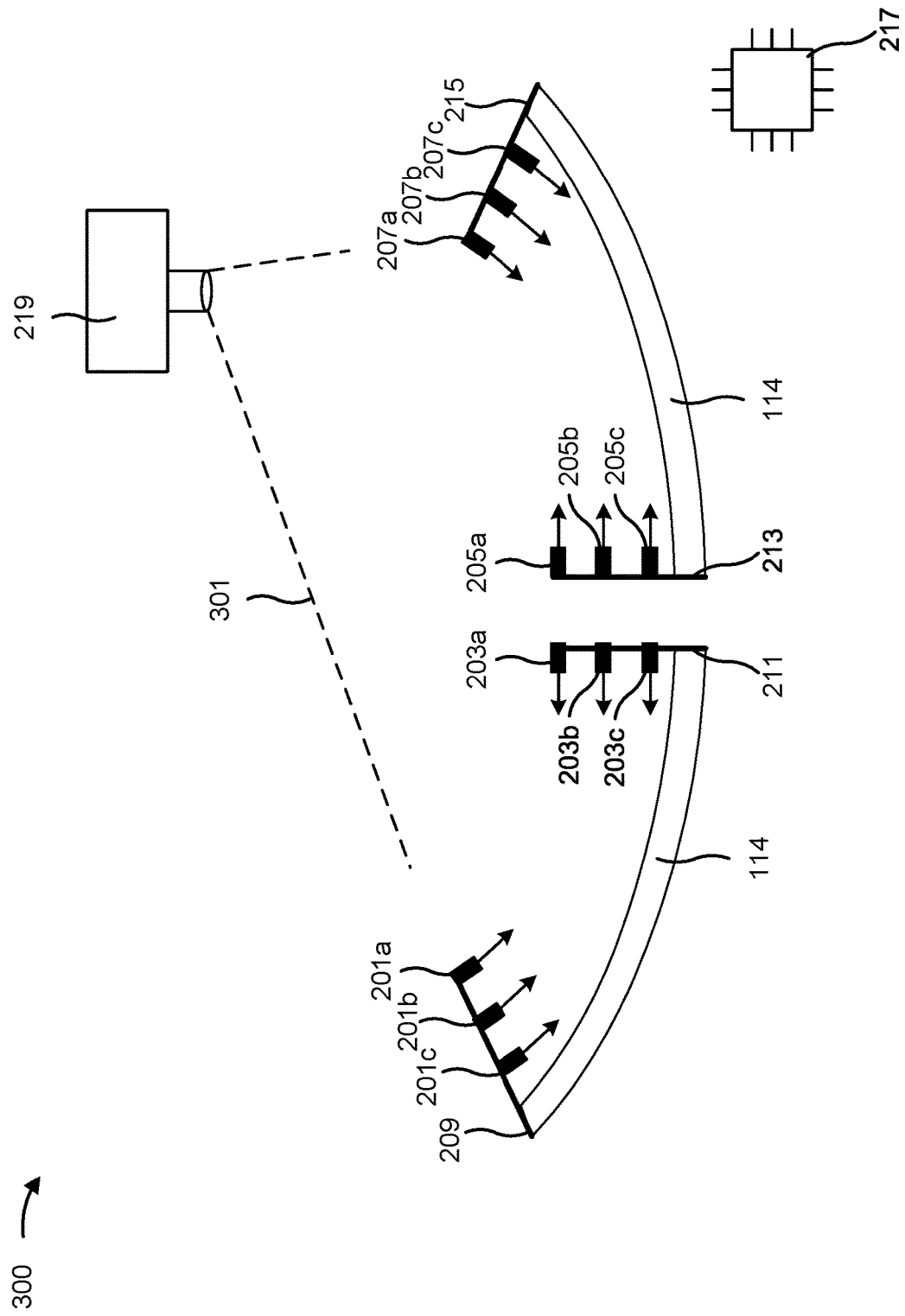
FIGS. 3A-3D are diagrams of an example implementation described herein.

As shown in FIG. 3A and by reference number 301, the optical sensor 219 may capture one or more images of the collector 114. In some implementations, the optical sensor 219 may include different groups of pixels that capture a plurality of images and combine the images in order to increase an accuracy of levels of tin contamination determined from the images (e.g., as described in greater detail below). Additionally, or alternatively, the optical sensor 219 may capture a plurality of images in succession (e.g., using a burst capture feature) and combine the images in order to increase an accuracy of levels of tin contamination determined from the images (e.g., as described in greater detail below). As an alternative, the optical sensor 219 may capture a single image in order to conserve power and processing resources of the optical sensor 219 and/or the control device 217.

Figure 3B:
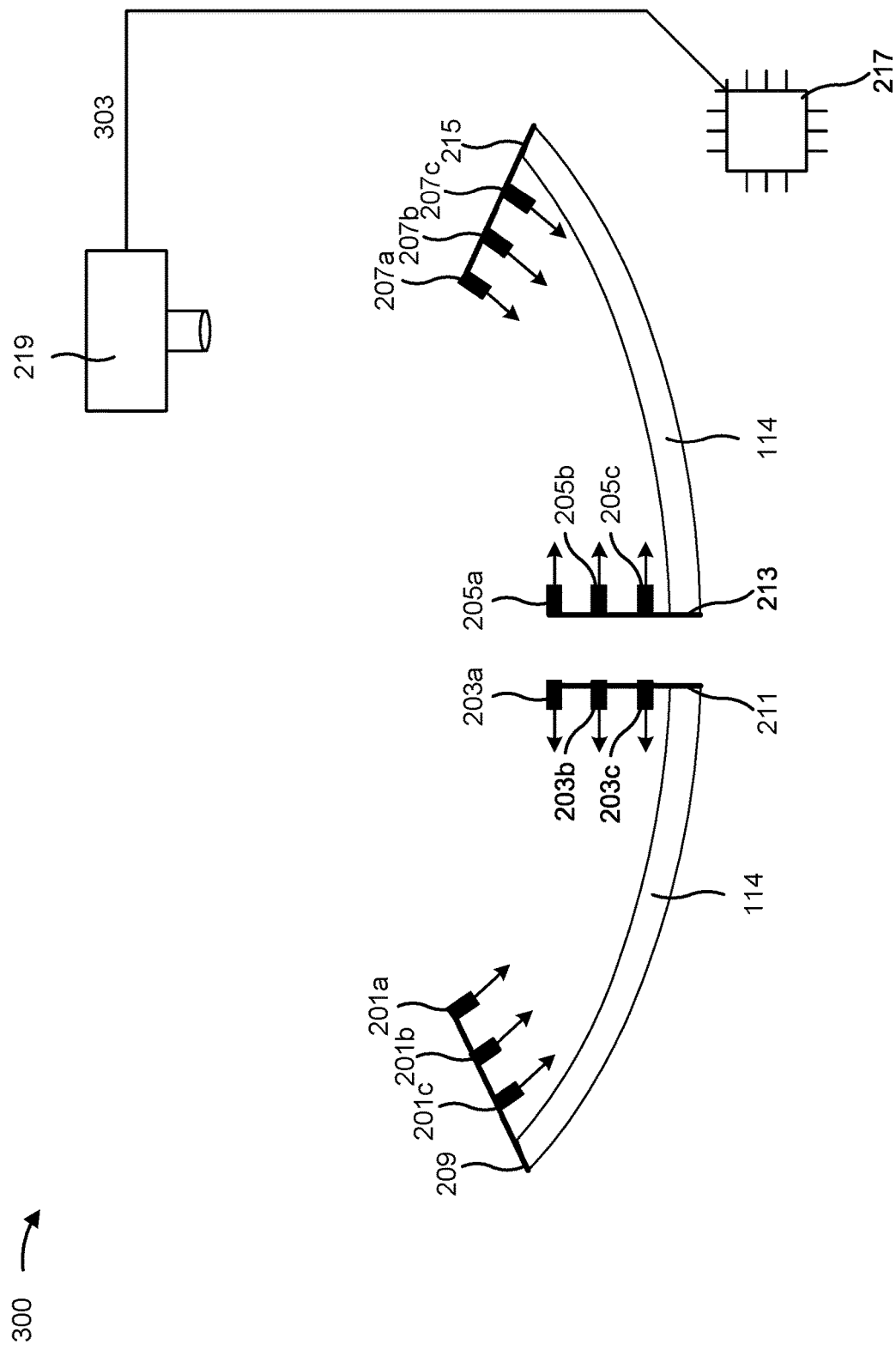

As shown in FIG. 3B, and by reference number 303, the optical sensor 219 may transmit, and the control device 217 may receive, the one or more images of the collector 114. As described in connection with FIG. 2A, the control device 217 may receive an indication of levels of tin contamination, associated with the collector 114, based on output from a model (e.g., an object identification model). Although implementation 300 is depicted with the control device 217 receiving the image(s) and determining the levels, other implementations may include the optical sensor 219 performing the determination and providing an indication of the levels to the control device 217. For example, using the optical sensor 219 to perform the determination can reduce communication latency between the optical sensor 219 and the control device 217 as well as reduce memory overhead at the control device 217. Using the control device 217 to perform the determination can reduce processing overhead at optical sensor 219 and allow for use of a less complex optical sensor rather than a more complex optical sensor.

Figure 3C:
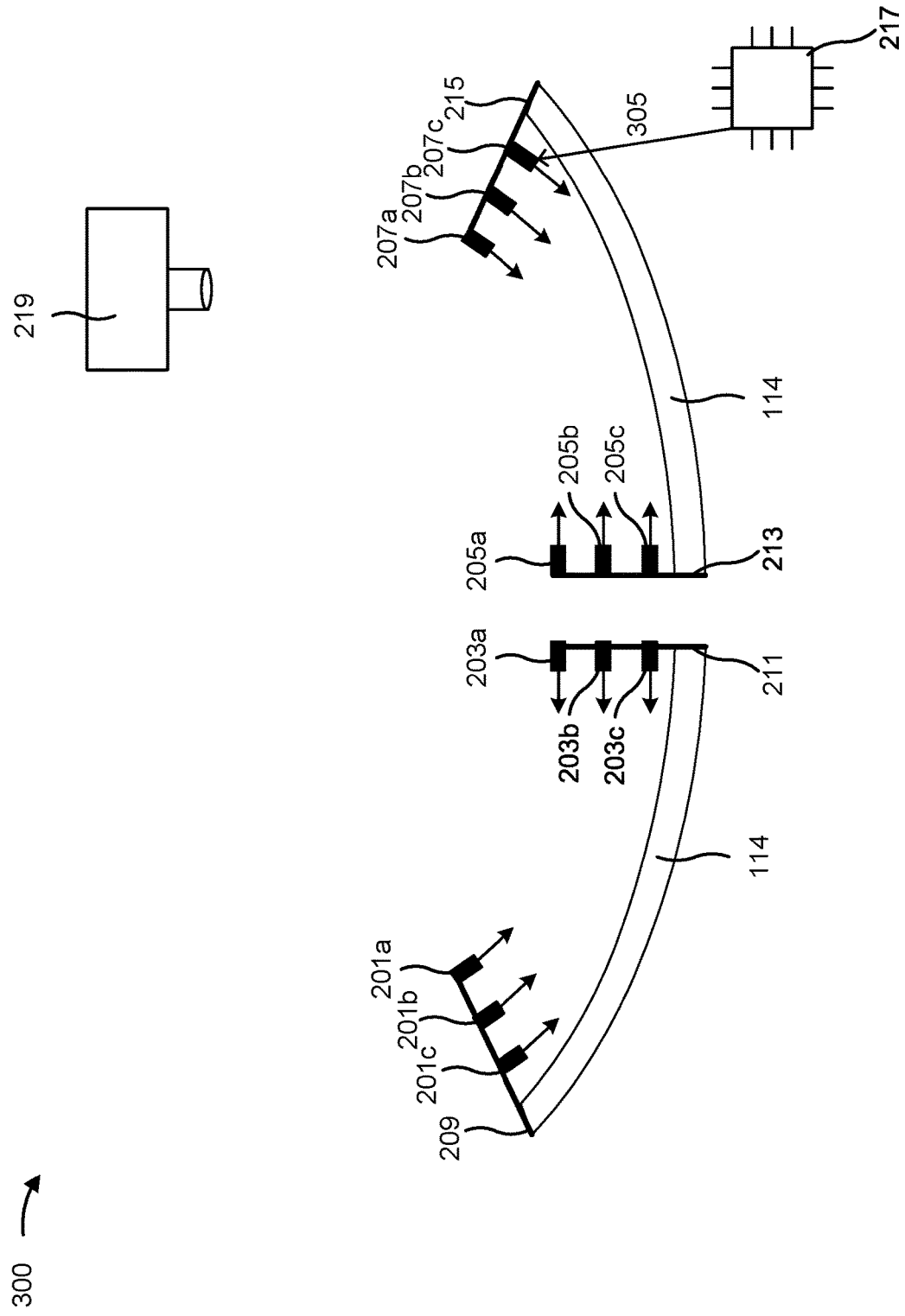

As shown in FIG. 3C, and by reference number 305, the control device 217 may independently control flow rates associated with the plurality of nozzles based on the indication of levels of tin contamination associated with the collector 114. For example, as described in connection with FIG. 2A, the control device 217 may determine flow rates for the nozzles, associated with the collector 114, based on output from a model (e.g., a machine learning model).

Figure 3D:
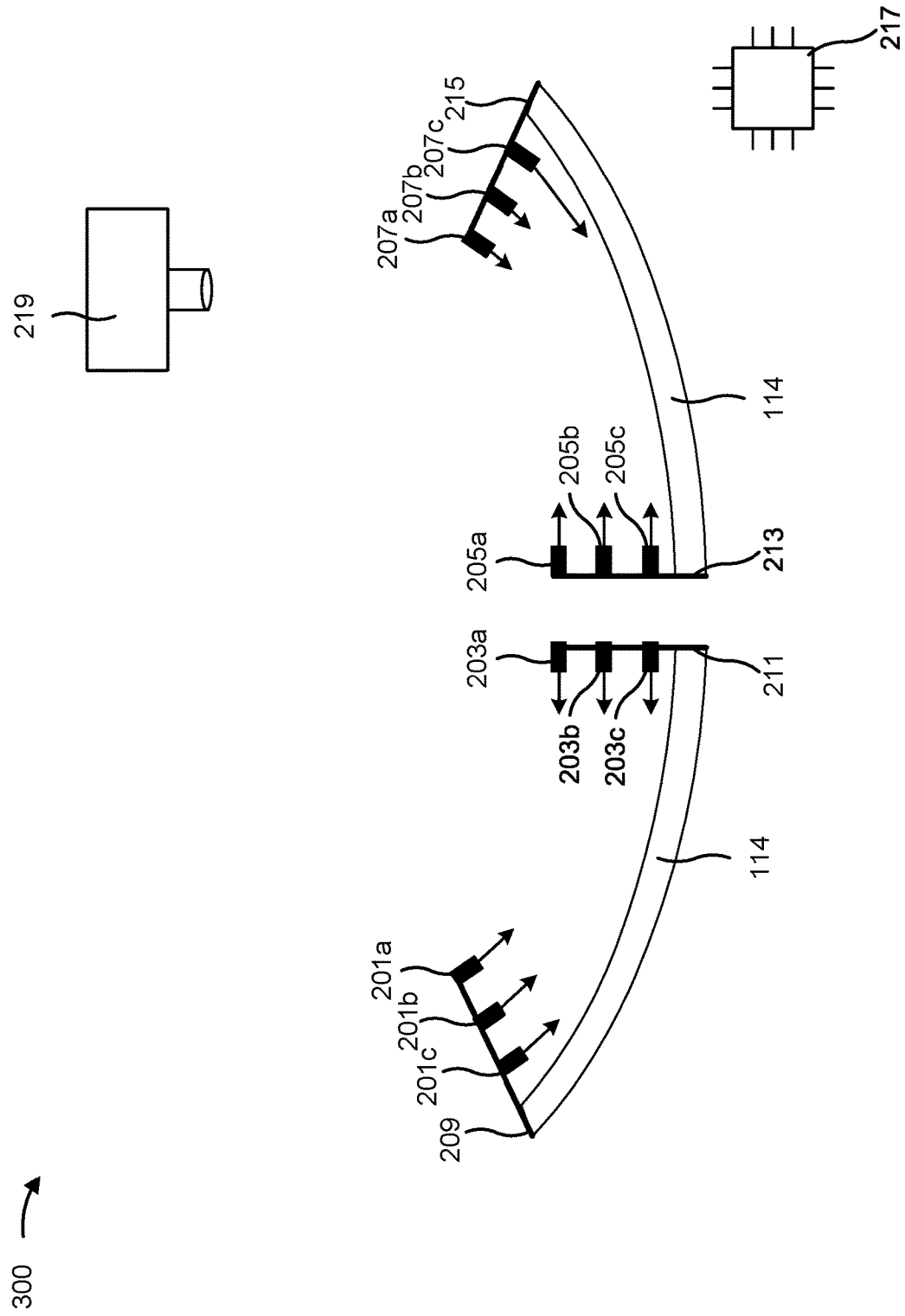

Accordingly, as shown in FIG. 3D, the control device 217 may increase a flow rate associated with at least one nozzle (e.g., nozzle 207c) based on tin contamination levels near the nozzle 207c being higher than levels associated with other portions of the collector 114. Additionally, in some implementations and as shown in FIG. 3D, the control device 217 may decrease a flow rate associated with at least one nozzle (e.g., nozzles 207a and 207b) to ensure that a total flow rate associated with the nozzles does not exceed a threshold.

The process described in connection with FIGS. 3A-3D may be iterative. For example, the optical sensor 219 may capture one or more updated images of the collector 114 periodically and/or based on commands received from the control device 217. In some implementations, the optical sensor 219 may be configured to capture the updated image(s) within an amount of time of capturing one or more previous images that is within a range from approximately one minute to approximately one hour. By selecting at least one minute between capturing images, processing resources and power are not wasted at the optical sensor 219 on detecting insignificant changes in levels of tin contamination associated with the collector 114. By selecting no more than one hour between capturing images, the control device 217 is able to compensate for any significant changes in levels of tin contamination associated with the collector 114 and thus increase lifetime for the collector 114 and reduce downtime for the EUV exposure tool. Additionally, or alternatively, the control device 217 may receive an indication that reflectivity associated with the collector 114 satisfies a threshold that triggers adjustment of the flow rates associated with the nozzles. Accordingly, the control device 217 may provide a command to the optical sensor 219 to capture the updated image(s) such that the control device 217 may update the flow rates associated with the nozzles.

Accordingly, the control device 217 may iteratively re-determine flow rates for the nozzles, associated with the collector 114, based on output from the model (e.g., a machine learning model) as described in connection with FIG. 2A. In some aspects, the control device 217 may additionally update the model (e.g., adjust parameters associated with a machine learning model and/or otherwise re-train, in part, the machine learning model) based on the iterations. For example, with each re-determination, the control device 217 may add, to a training set associated with the model, the levels of tin contamination (based on images from the optical sensor 219), updated levels of tin contamination (based on updated images from the optical sensor 219), and flow rates associated with the nozzles during a time period between receiving the levels and receiving the updated levels. Accordingly, the control device 217 may continue to improve accuracy of the model without wasting processing resources and power on separate training stages for the model.

As indicated above, FIGS. 3A-3D are provided as an example. Other examples may differ from what is described with regard to FIGS. 3A-3D. The number and arrangement of devices shown in FIGS. 3A-3D are provided as an example. In practice, there may be additional devices, fewer devices, different devices, or differently arranged devices than those shown in FIGS. 3A-3D. Furthermore, two or more devices shown in FIGS. 3A-3D may be implemented within a single device, or a single device shown in FIGS. 3A-3D may be implemented as multiple, distributed devices. Additionally, or alternatively, a set of devices (e.g., one or more devices) shown in FIGS. 3A-3D may perform one or more functions described as being performed by another set of devices shown in FIGS. 3A-3D.

FIGS. 4A-4D are a diagram of an example implementation 400 associated with cleaning surfaces (e.g., collector 114) within an EUV exposure tool (e.g., an EUV lithography system). Example implementation 400 includes a collector 114 with a plurality of hydrogen nozzles (e.g., nozzle 201a, nozzle 201b, nozzle 201c, nozzle 203a, nozzle 203b, nozzle 203c, nozzle 205a, nozzle 205b, nozzle 205c, nozzle 207a, nozzle 207b, and nozzle 207c) attached to the collector 114 via one or more supports (e.g., support 209, support 211, support 213, and support 215), a control device 217, and an optical sensor 219. These devices are described in more detail in connection with FIGS. 1, 2A, 2B, and/or 6.

In example implementation 400, the nozzles are mounted on corresponding movement mechanisms. For example, nozzle 201a is mounted on movement mechanism 401a, nozzle 201b is mounted on movement mechanism 401b, nozzle 201c is mounted on movement mechanism 401c, nozzle 203a is mounted on movement mechanism 403a, nozzle 203b is mounted on movement mechanism 403b, nozzle 203c is mounted on movement mechanism 403c, nozzle 205a is mounted on movement mechanism 405a, nozzle 205b is mounted on movement mechanism 405b, nozzle 205c is mounted on movement mechanism 405c, nozzle 207a is mounted on movement mechanism 407a, nozzle 207b is mounted on movement mechanism 407b, and nozzle 207c is mounted on movement mechanism 407c. In one example, each movement mechanism includes a ball bearing with at least one motor to swivel the corresponding nozzle using the ball bearing. In another example, each movement mechanism includes one or more joints with at least one motor to move the corresponding nozzle along one or more axes associated with the one or more joints. The movement mechanisms may include additional or alternative components that allow the nozzles to be moved along one or more axes.

Figure 4A:
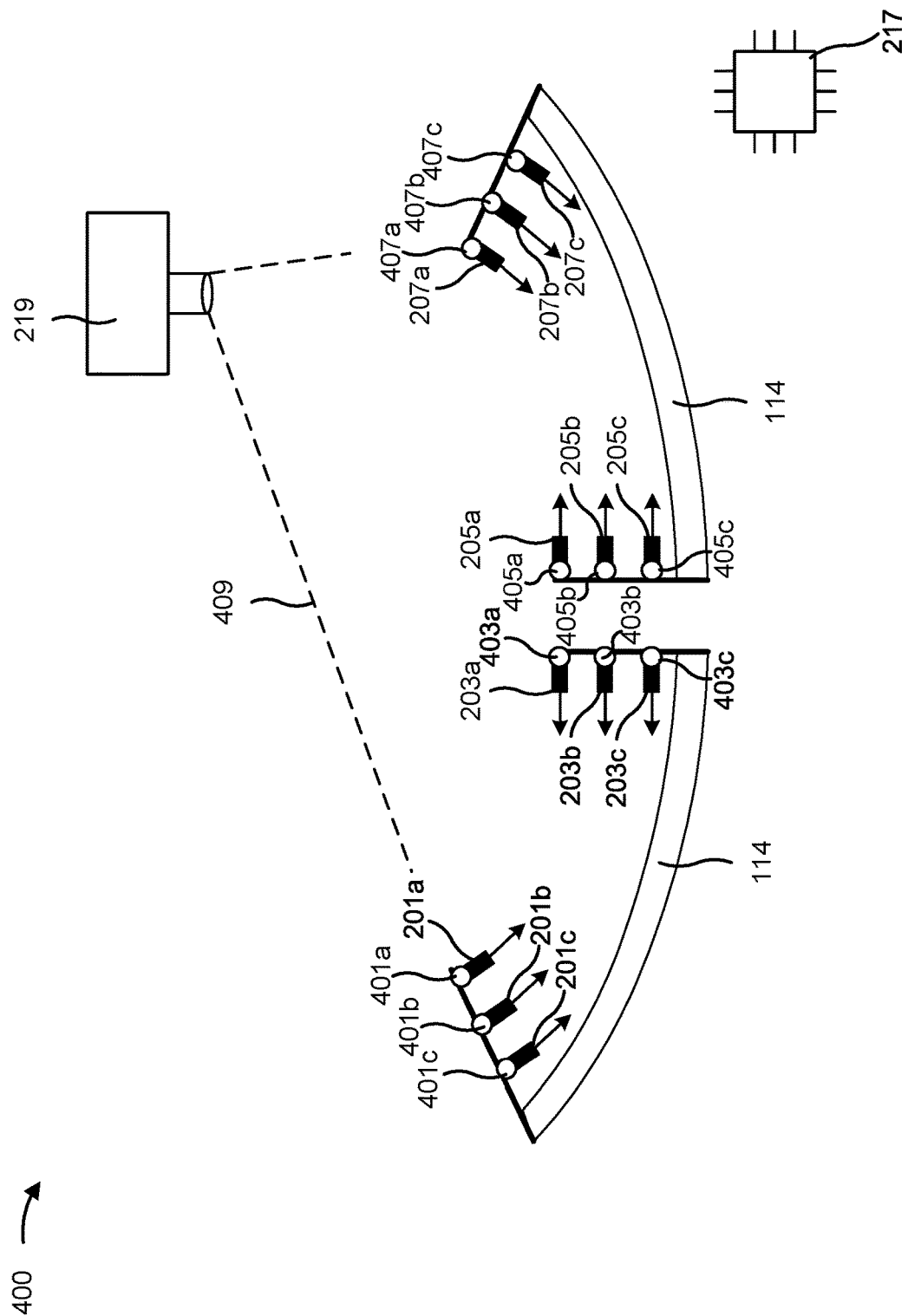

As shown in FIG. 4A and by reference number 409, the optical sensor 219 may capture one or more images of the collector 114. In some implementations, the optical sensor 219 may include different groups of pixels that capture a plurality of images and combine the images in order to increase an accuracy of levels of tin contamination determined from the images (e.g., as described in greater detail below). Additionally, or alternatively, the optical sensor 219 may capture a plurality of images in succession (e.g., using a burst capture feature) and combine the images in order to increase an accuracy of levels of tin contamination determined from the images (e.g., as described in greater detail below). As an alternative, the optical sensor 219 may capture a single image in order to conserve power and processing resources of the optical sensor 219 and/or the control device 217.

Figure 4B:
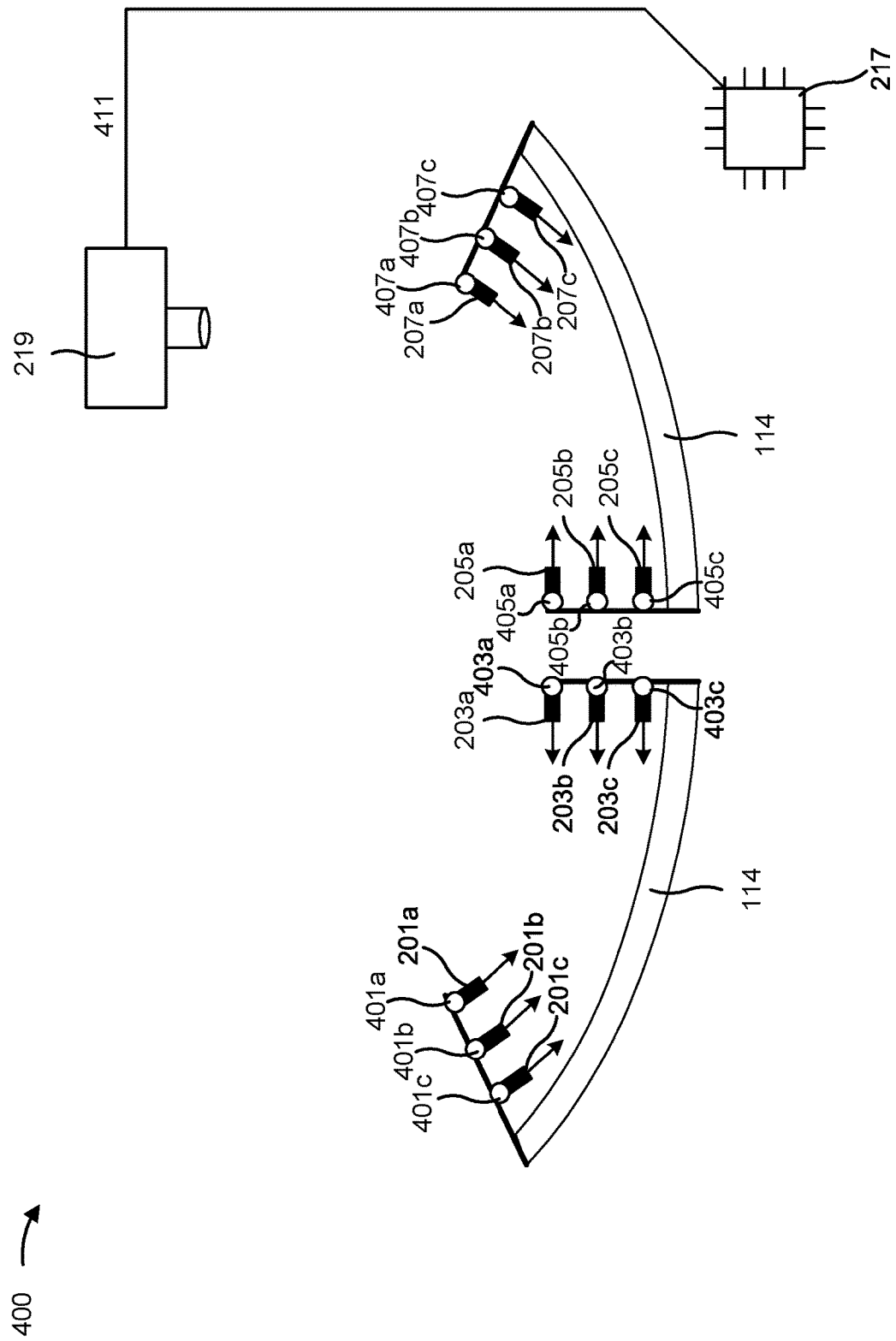

As shown in FIG. 4B, and by reference number 411, the optical sensor 219 may transmit, and the control device 217 may receive, the one or more images of the collector 114. As described in connection with FIG. 2A, the control device 217 may receive an indication of levels of tin contamination, associated with the collector 114, based on output from a model (e.g., an object identification model). Although implementation 400 is depicted with the control device 217 receiving the image(s) and determining the levels, other implementations may include the optical sensor 219 performing the determination and providing an indication of the levels to the control device 217. For example, using the optical sensor 219 to perform the determination can reduce communication latency between the optical sensor 219 and the control device 217 as well as reduce memory overhead at the control device 217. Using the control device 217 to perform the determination can reduce processing overhead at optical sensor 219 and allow for use of a less complex optical sensor rather than a more complex optical sensor.

Figure 4C:
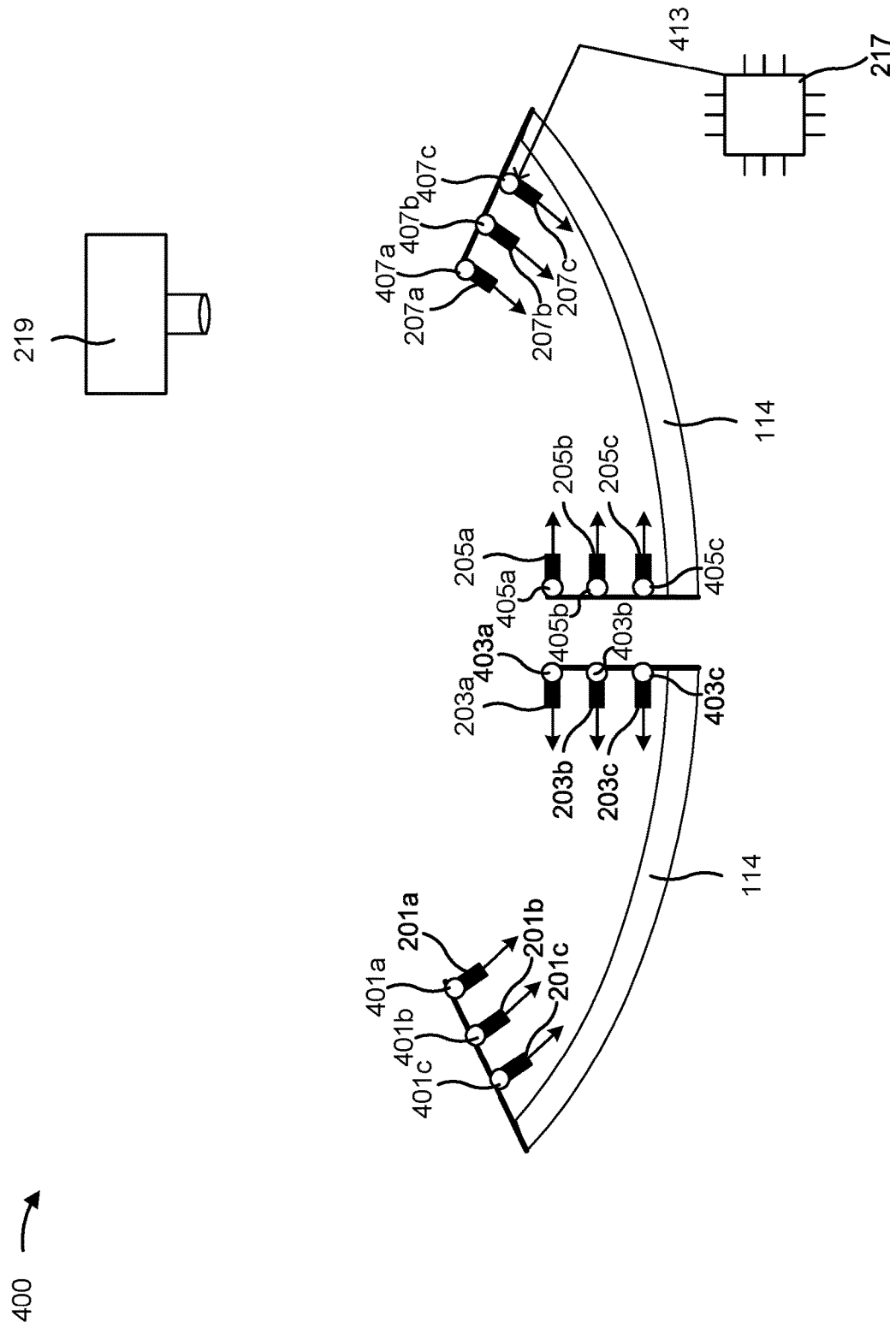

As shown in FIG. 4C, and by reference number 413, the control device 217 may independently control movement of the plurality of nozzles based on the indication of levels of tin contamination associated with the collector 114. The control device 217 may use an equation and/or another formula that accepts the tin contamination levels as input and outputs directions in which to point the nozzles.

In some implementations, the control device 217 is configured to use a machine learning model, which is trained based on historical data, to control movement of the nozzles. For example, the machine learning model may correlate historical changes in tin contamination (e.g., across different images from the optical sensor 219 over time) with historical directions in which the nozzles were pointed. Other parameters used by the model may include make/model information associated with the nozzles, shapes associated with the nozzles, locations of the nozzles, and/or hydrogen output distributions associated with the nozzles, among other examples. For a combination of directions and/or parameters, the machine learning model may have been trained to estimate directions that result in changes to levels of tin contamination. Accordingly, the machine learning model may accept data indicating the difference between the levels of tin contamination and the desired levels of tin contamination and output data indicating the directions in which the control device 217 should direct the nozzles.

Accordingly, as shown in FIG. 4D, the control device 217 may move at least one nozzle (e.g., nozzle 207c) based on tin contamination levels near the nozzle 207c being lower than levels associated with other portions of the collector 114 (such that the nozzle 207c should be aimed away from the collector 114 to provide protection rather than cleaning). In another example, the control device 217 may move at least one nozzle based on tin contamination levels near the nozzle being higher than levels associated with other portions of the collector 114 (such that the nozzle should be aimed towards from the collector 114 to provide cleaning rather than protection).

The process described in connection with FIGS. 4A-4D may be iterative. For example, the optical sensor 219 may capture one or more updated images of the collector 114 periodically and/or based on commands received from the control device 217. In some implementations, and as described in connection with FIG. 3D, the optical sensor 219 may be configured to capture the updated image(s) within an amount of time of capturing one or more previous images that is within a range from approximately one minute to approximately one hour. Additionally, or alternatively, the control device 217 may receive an indication that reflectivity associated with the collector 114 satisfies a threshold that triggers movement of the nozzles. Accordingly, the control device 217 may provide a command to the optical sensor 219 to capture the updated image(s) such that the control device 217 may update directions in which the nozzles are pointed.

Accordingly, the control device 217 may iteratively re-determine direction in which the nozzles point based on output from the model (e.g., a machine learning model). In some aspects, the control device 217 may additionally update the model (e.g., adjust parameters associated with a machine learning model and/or otherwise re-train, in part, the machine learning model) based on the iterations. For example, with each re-determination, the control device 217 may add, to a training set associated with the model, the levels of tin contamination (based on images from the optical sensor 219), updated levels of tin contamination (based on updated images from the optical sensor 219), and directions associated with the nozzles during a time period between receiving the levels and receiving the updated levels. Accordingly, the control device 217 may continue to improve accuracy of the model without wasting processing resources and power on separate training stages for the model.

Implementations 300 and 400 may be combined. For example, the control device 217 may control flow rates and directions associated with the nozzles based on the levels of tin contamination associated with the collector 114. Accordingly, in some implementations, the control device 217 may use a single machine learning model that outputs data indicating both flow rates and directions to use.

As indicated above, FIGS. 4A-4D are provided as an example. Other examples may differ from what is described with regard to FIGS. 4A-4D. The number and arrangement of devices shown in FIGS. 4A-4D are provided as an example. In practice, there may be additional devices, fewer devices, different devices, or differently arranged devices than those shown in FIGS. 4A-4D. Furthermore, two or more devices shown in FIGS. 4A-4D may be implemented within a single device, or a single device shown in FIGS. 4A-4D may be implemented as multiple, distributed devices. Additionally, or alternatively, a set of devices (e.g., one or more devices) shown in FIGS. 4A-4D may perform one or more functions described as being performed by another set of devices shown in FIGS. 4A-4D.

FIGS. 5A-5D are diagrams of an example implementation 500 associated with cleaning surfaces (e.g., collector 114) within an EUV exposure tool (e.g., an EUV lithography system). Example implementation 500 includes a collector 114 with a plurality of hydrogen nozzles (e.g., nozzle 201a, nozzle 201b, nozzle 201c, nozzle 203a, nozzle 203b, nozzle 203c, nozzle 205a, nozzle 205b, nozzle 205c, nozzle 207a, nozzle 207b, and nozzle 207c) attached to the collector 114 via one or more supports (e.g., support 209, support 211, support 213, and support 215), a control device 217, and an optical sensor 219. These devices are described in more detail in connection with FIGS. 1, 2A, 2B, and/or 6.

In example implementation 500, a droplet head 122 controls insertion of tin droplets above the collector 114 (e.g., tin droplet 505a and tin droplet 505b). Additionally, the droplet head 122 may be associated with an optical sensor 501.

Figure 5A:
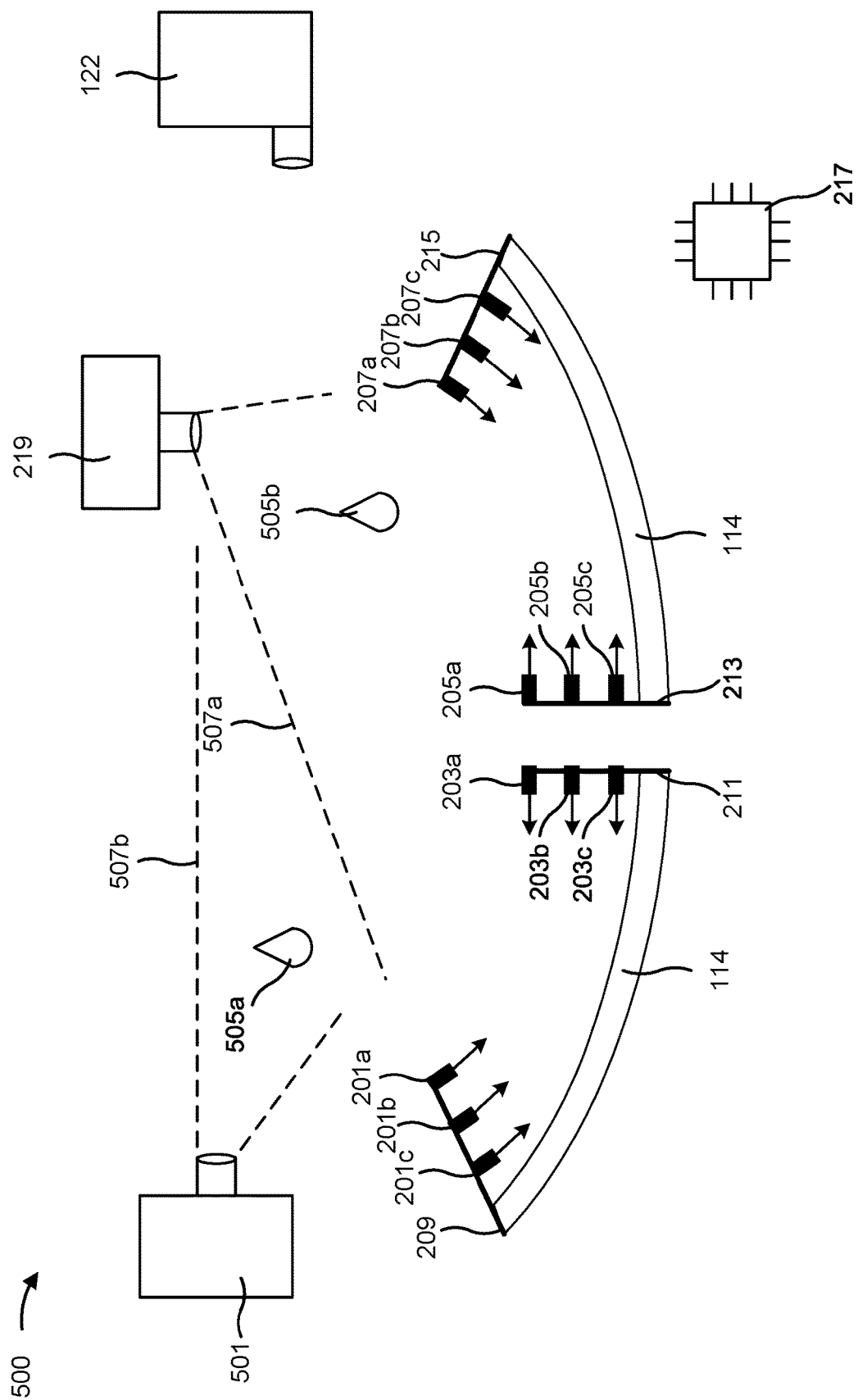
FIGS. 5A-5D are diagrams of an example implementation described herein.

As shown in FIG. 5A and by reference number 507a, the optical sensor 219 may capture one or more images of the collector 114. In some implementations, the optical sensor 219 may include different groups of pixels that capture a plurality of images and combine the images in order to increase an accuracy of levels of tin contamination determined from the images (e.g., as described in greater detail below). Additionally, or alternatively, the optical sensor 219 may capture a plurality of images in succession (e.g., using a burst capture feature) and combine the images in order to increase an accuracy of levels of tin contamination determined from the images (e.g., as described in greater detail below). As an alternative, the optical sensor 219 may capture a single image in order to conserve power and processing resources of the optical sensor 219 and/or the control device 217.

As further shown in FIG. 5A and by reference number 507b, the optical sensor 501 may capture one or more images including the droplets 505a and 505b. In some implementations, the optical sensor 501 may include different groups of pixels that capture a plurality of images and combine the images in order to increase an accuracy of locations of the tin droplets 505a and 505b determined from the images (e.g., as described in greater detail below). Additionally, or alternatively, the optical sensor 501 may capture a plurality of images in succession (e.g., using a burst capture feature) and combine the images in order to increase an accuracy of locations of the tin droplets 505a and 505b determined from the images (e.g., as described in greater detail below). As an alternative, the optical sensor 501 may capture a single image in order to conserve power and processing resources of the optical sensor 501 and/or the control device 217.

Although depicted as separate optical devices, other implementations may include a single optical sensor that captures images of both the collector 114 and the droplets 505a and 505b. Using a single optical sensor conserves power and processing resources used to obtain one or more images for determining the levels of tin contamination and the locations of the tin droplets 505a and 505b. Using multiple optical sensors increases accuracy of both the levels of tin contamination and the locations of the tin droplets 505a and 505b, which results in increased efficiency of the EUV exposure tool.

Figure 5B:
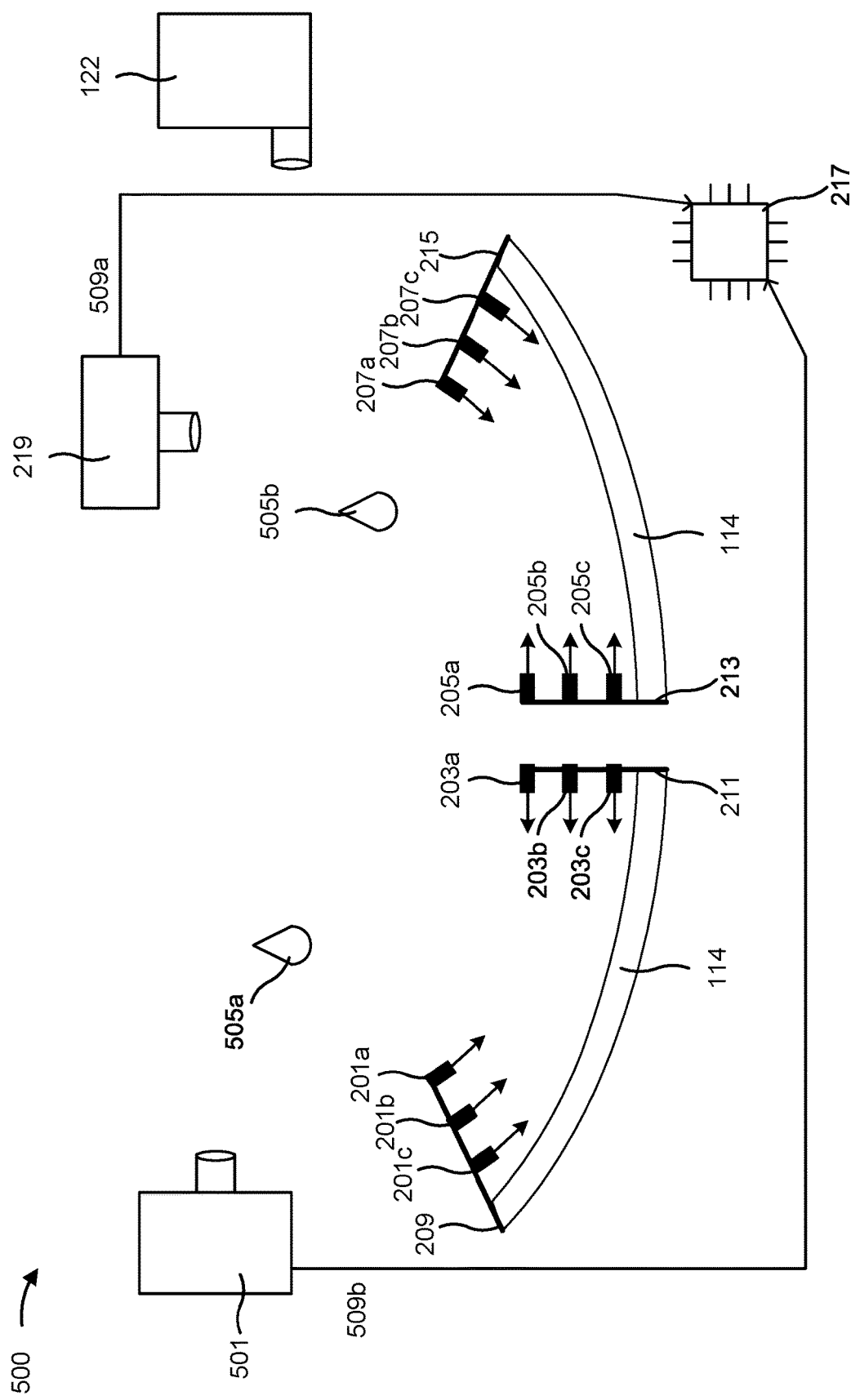

As shown in FIG. 5B, and by reference number 509a, the optical sensor 219 may transmit, and the control device 217 may receive, the one or more images of the collector 114. As described in connection with FIG. 2A, the control device 217 may receive an indication of levels of tin contamination, associated with the collector 114, based on output from a model (e.g., an object identification model). Although implementation 500 is depicted with the control device 217 receiving the image(s) and determining the levels, other implementations may include the optical sensor 219 performing the determination and providing an indication of the levels to the control device 217. For example, using the optical sensor 219 to perform the determination can reduce communication latency between the optical sensor 219 and the control device 217 as well as reduce memory overhead at the control device 217. Using the control device 217 to perform the determination can reduce processing overhead at optical sensor 219 and allow for use of a less complex optical sensor rather than a more complex optical sensor.

As further shown in FIG. 5B, and by reference number 509b, the optical sensor 501 may transmit, and the control device 217 may receive, the one or more images of the tin droplets 505a and 505b. Accordingly, the control device 217 may identify locations of the tin droplets 505a and 505b using the one or more images. For example, the control device 217 may use an object detection algorithm (e.g., a neural network and/or other model that identifies tin deposits within the one or more images), a color and/or brightness algorithm (e.g., to identify tin deposits within the one or more images based on darker portions and/or differently colored portions of the image(s)), and/or another type of model to determine locations of the tin droplets 505a and 505b.

Although implementation 500 is depicted with the control device 217 receiving the image(s) and determining the locations, other implementations may include the optical sensor 501 performing the determination and providing an indication of the locations to the control device 217. For example, using the optical sensor 501 to perform the determination can reduce communication latency between the optical sensor 501 and the control device 217 as well as reduce memory overhead at the control device 217. Using the control device 217 to perform the determination can reduce processing overhead at optical sensor 501 and allow for use of a less complex optical sensor rather than a more complex optical sensor.

Figure 5C:
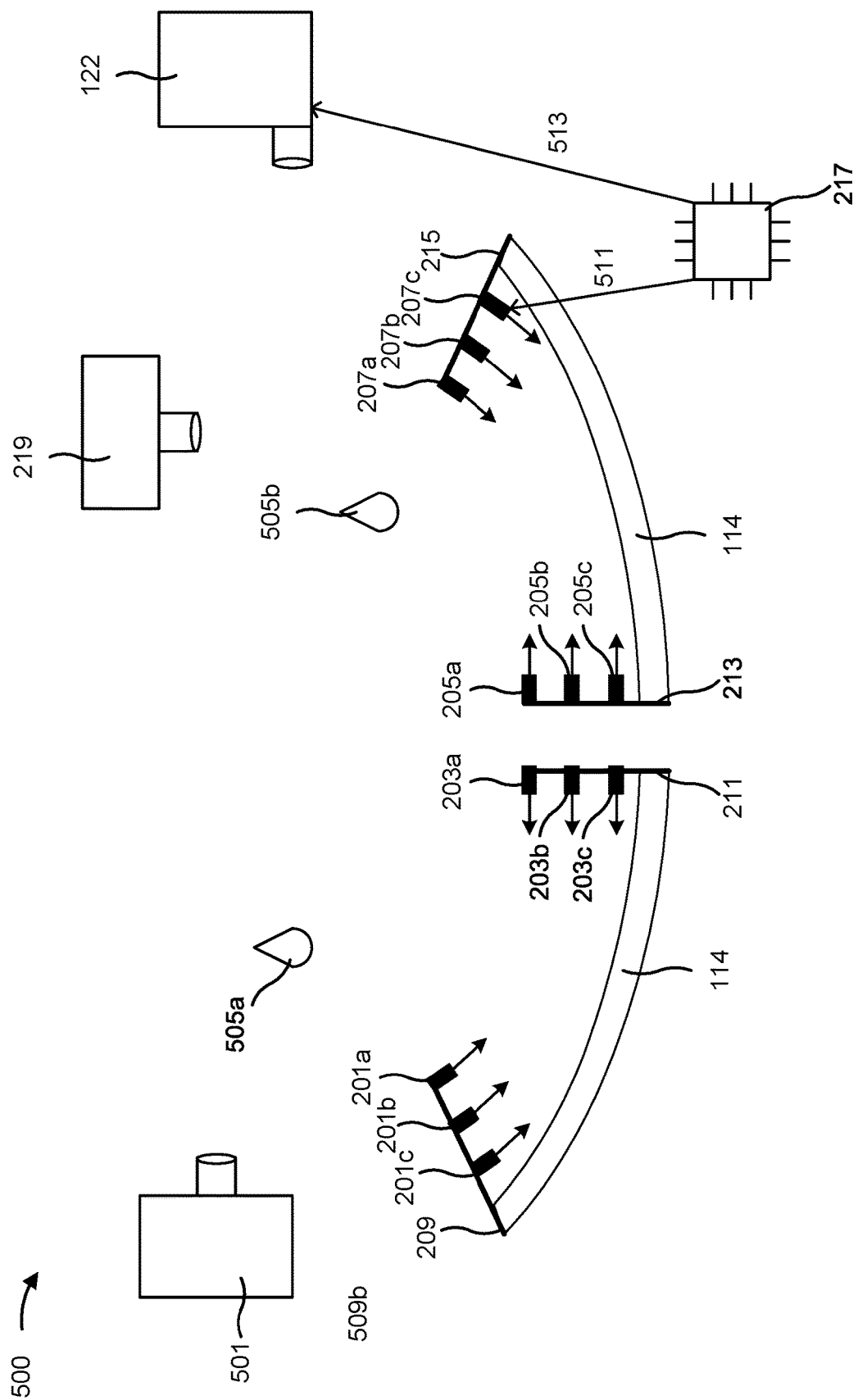

As shown in FIG. 5C, and by reference number 511, the control device 217 may independently control flow rates associated with the plurality of nozzles based on the indication of levels of tin contamination associated with the collector 114. For example, as described in connection with FIG. 2A, the control device 217 may determine flow rates for the nozzles, associated with the collector 114, based on output from a model (e.g., a machine learning model). Additionally, or alternatively, the control device 217 may independently control flow rates associated with the plurality of nozzles based on the indication of locations of the tin droplets 505a and 505b. For example, the control device 217 may increase a flow rate associated with a nozzle near the tin droplet 505b if the tin droplet 505b should be moved away from that nozzle in order to increase generation of EUV radiation. In another example, the control device 217 may decrease a flow rate associated with a nozzle near the tin droplet 505a if the tin droplet 505a should stop moving away from that nozzle in order to increase generation of EUV radiation.

As further shown in FIG. 5C, and by reference number 513, the control device 217 may independently control insertion of a new droplet (shown as new droplet 551 in FIG. 5D) into the EUV exposure tool. The control device 217 may use an equation and/or another formula that accepts the locations of the tin droplets 505a and 505b and/or the tin contamination levels as input and outputs directions for inserting the new droplet 551 (e.g., a direction, a velocity, a size, a shape, and/or other physical properties associated with the new droplet 551).

In some implementations, the control device 217 is configured to use a machine learning model, which is trained based on historical data, to control insertion of new droplets. For example, the machine learning model may correlate historical changes in locations of existing tin droplets (e.g., across different images from the optical sensor 501 over time) and/or tin contamination (e.g., across different images from the optical sensor 219 over time) with historical flow rates associated with the nozzles. Other parameters used by the model may include make/model information associated with the nozzles, shapes associated with the nozzles, locations of the nozzles, hydrogen output distributions associated with the nozzles, and/or make/model information associated with the droplet head 122, among other examples. For a combination of directions and/or parameters, the machine learning model may have been trained to estimate flow rates that result in changes to droplet locations. Accordingly, the machine learning model may accept data indicating the difference between the locations of existing tin droplets and a desired distribution of tin droplets and output data associated with insertion of the new droplet by the droplet head 122.

Figure 5D:
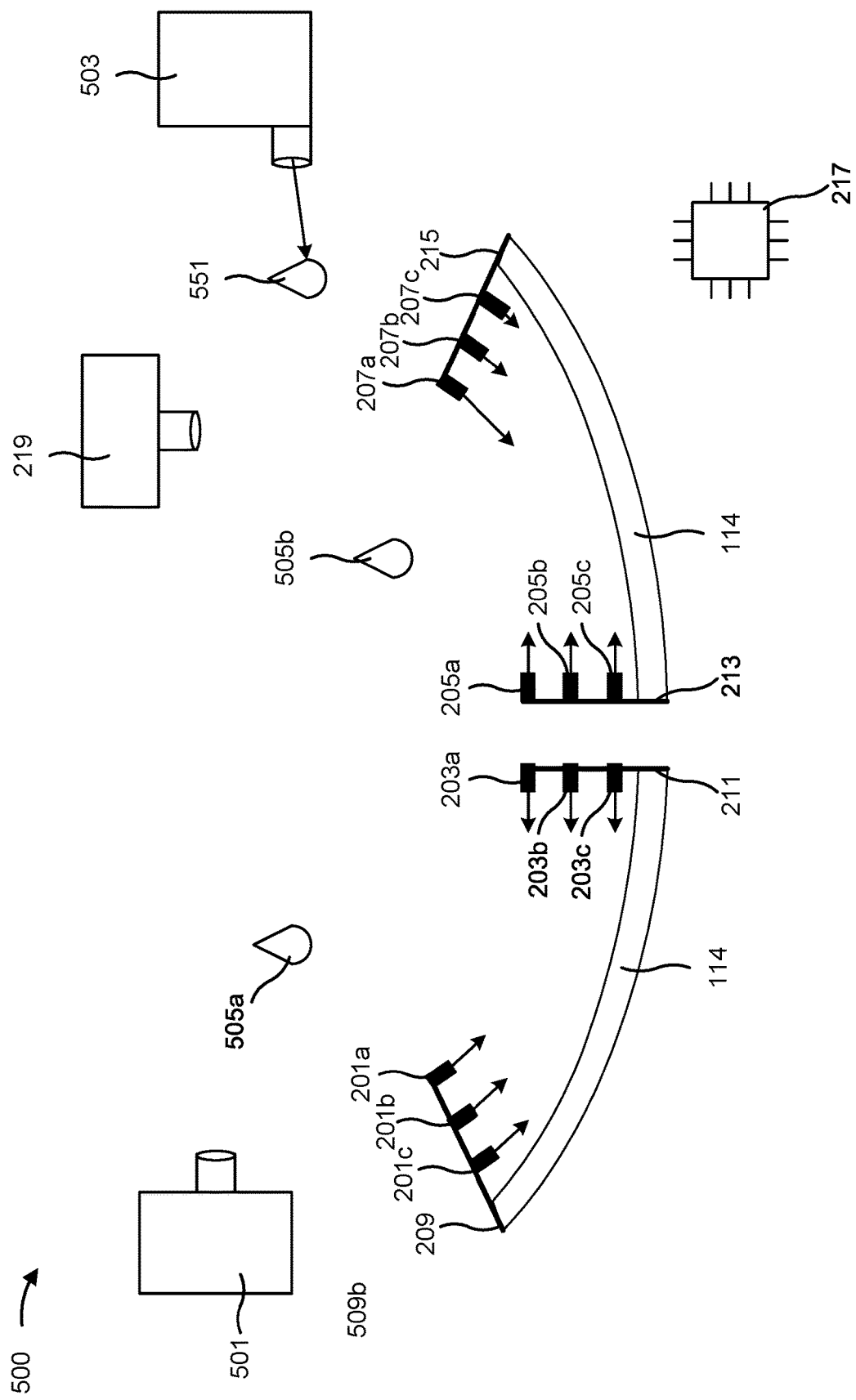

Accordingly, as shown in FIG. 5D, the control device 217 may increase a flow rate associated with at least one nozzle (e.g., nozzle 207*a*) based on tin contamination levels near the nozzle 207*c* being higher than levels associated with other portions of the collector 114. Additionally, in some implementations and as shown in FIG. 3D, the control device 217 may decrease a flow rate associated with at least one nozzle (e.g., nozzles 207*b* and 207*c*) to ensure that a total flow rate associated with the nozzles does not exceed a threshold.

As further shown in FIG. 5D, the control device 217 may control insertion of new droplet 551. For example, the control device 217 may provide a command, associated with a desired velocity, size, shape, and/or other property of the new droplet 551, to the droplet head 503 based on the tin contamination levels and/or locations of the tin droplets 505*a* and 505*b*.

The process described in connection with FIGS. 5A-5D may be iterative. For example, the optical sensor 219 may capture one or more updated images of the collector 114 periodically and/or based on commands received from the control device 217. In some implementations, and as described above in connection with FIG. 3D, the optical sensor 219 may be configured to capture the updated image(s) within an amount of time of capturing one or more previous images that is within a range from approximately one minute to approximately one hour. Additionally, or alternatively, the control device 217 may receive an indication that reflectivity associated with the collector 114 satisfies a threshold that triggers adjustment of the flow rates associated with the nozzles. Accordingly, the control device 217 may provide a command to the optical sensor 219 to capture the updated image(s) such that the control device 217 may update the flow rates associated with the nozzles. The optical sensor 501 may similarly capture one or more updated images of the tin droplets.

Accordingly, the control device 217 may iteratively re-determine flow rates for the nozzles, associated with the collector 114, based on output from the model (e.g., a machine learning model) as described in connection with FIG. 2A. In some aspects, the control device 217 may additionally update the model (e.g., adjust parameters associated with a machine learning model and/or otherwise re-train, in part, the machine learning model) based on the iterations. For example, with each re-determination, the control device 217 may add, to a training set associated with the model, the levels of tin contamination (based on images from the optical sensor 219), updated levels of tin contamination (based on updated images from the optical sensor 219), and flow rates associated with the nozzles during a time period between receiving the levels and receiving the updated levels. Accordingly, the control device 217 may continue to improve accuracy of the model without wasting processing resources and power on separate training stages for the model.

Similarly, the control device 217 may iteratively re-determine properties for insertions of new droplets based on output from a different model (e.g., a machine learning model) as described above. In some aspects, the control device 217 may additionally update the model (e.g., adjust parameters associated with a machine learning model and/or otherwise re-train, in part, the machine learning model) based on the iterations. For example, with each re-determination, the control device 217 may add, to a training set associated with the model, the levels of tin contamination (based on images from the optical sensor 219) and/or the locations of tin droplets (based on images from the optical sensor 501), updated levels of tin contamination (based on updated images from the optical sensor 219) and/or updated locations of tin droplets (based on updated images from the optical sensor 501), and properties for insertions of new droplets during a time period between receiving the levels and receiving the updated levels. Accordingly, the control device 217 may continue to improve accuracy of the model without wasting processing resources and power on separate training stages for the model.

Implementations 400 and 500 may be combined. For example, the control device 217 may control directions associated with the nozzles based on the levels of tin contamination associated with the collector 114 and the locations of tin droplets 505*a* and 505*b*. Accordingly, in some implementations, the control device 217 may use a single machine learning model that outputs data indicating both flow rates and directions to use.

As indicated above, FIGS. 5A-5D are provided as an example. Other examples may differ from what is described with regard to FIGS. 5A-5D. The number and arrangement of devices shown in FIGS. 5A-5D are provided as an example. In practice, there may be additional devices, fewer devices, different devices, or differently arranged devices than those shown in FIGS. 5A-5D. Furthermore, two or more devices shown in FIGS. 5A-5D may be implemented within a single device, or a single device shown in FIGS. 5A-5D may be implemented as multiple, distributed devices. Additionally, or alternatively, a set of devices (e.g., one or more devices) shown in FIGS. 5A-5D may perform one or more functions described as being performed by another set of devices shown in FIGS. 5A-5D.

Figure 6:
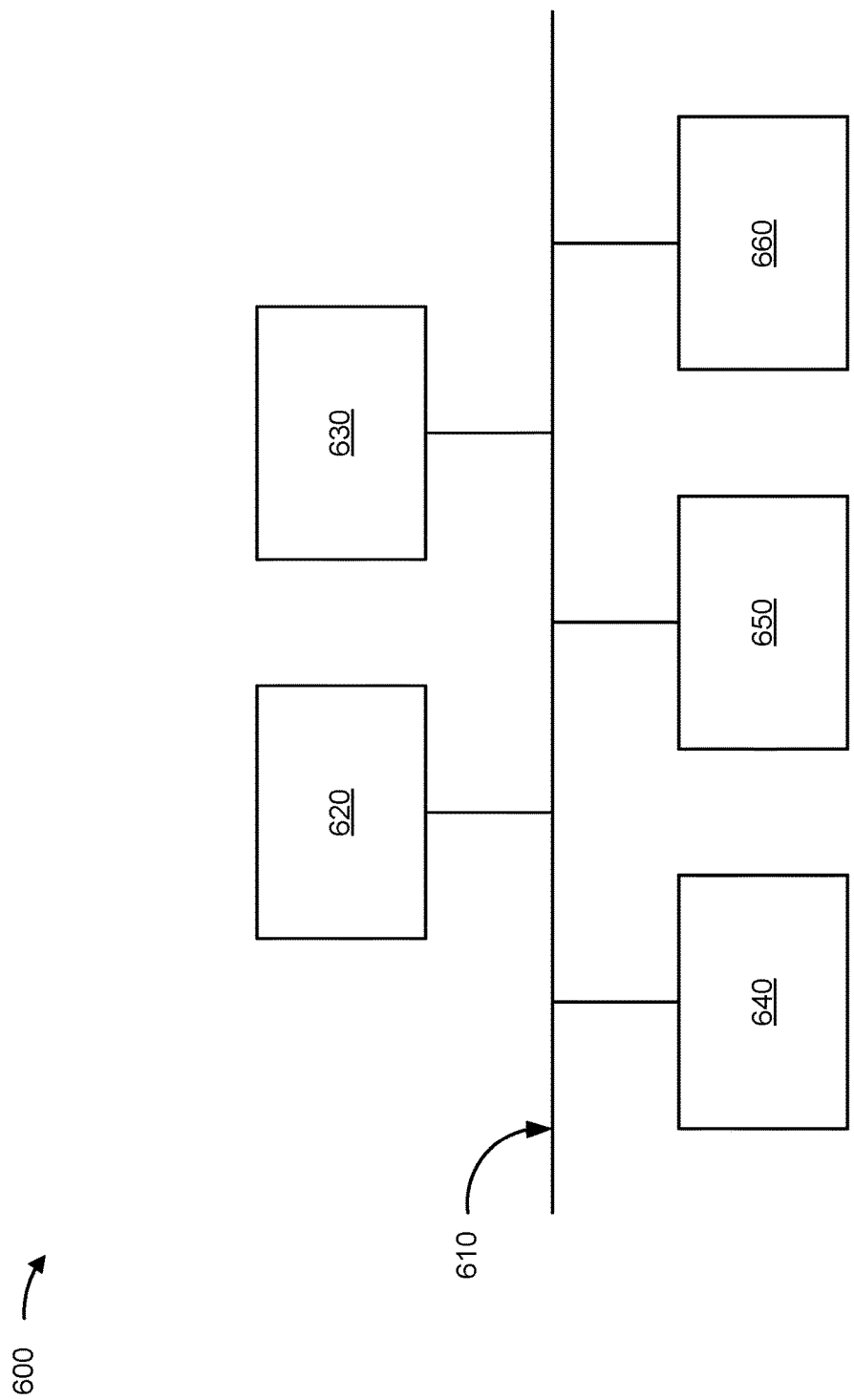
FIG. 6 is a diagram of example components of one or more devices of FIG. 1 described herein.

FIG. 6 is a diagram of example components of a device 600, which may correspond to a controller (e.g., control device 217), a sensor (e.g., optical sensor 219, optical sensor 501, and/or pressure sensor(s) 259*a*, 259*b*, 259*c*, and/or 259*d*), a movement mechanism (e.g., movement mechanism(s) 401*a*, 401*b*, 401*c*, 403*a*, 403*b*, 403*c*, 405*a*, 405*b*, 405*c*, 407*a*, 407*b*, and/or 407*c*), and/or a droplet generator head (e.g., droplet head 122). In some implementations, a controller, a sensor, a movement mechanism, and/or a droplet generator head may include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry may be used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
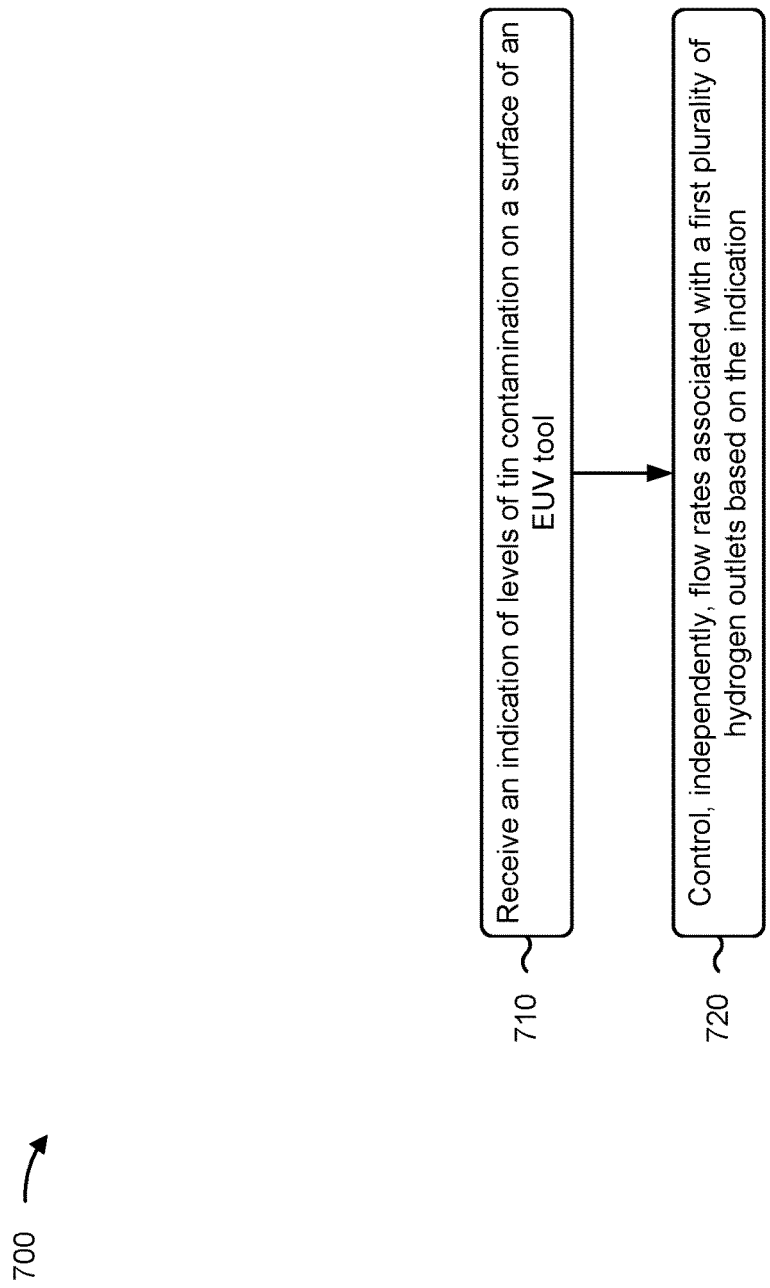
FIG. 7 is a flowchart of an example process relating to using the semiconductor processing tool described herein.

FIG. 7 is a flowchart of an example process 700 associated with protecting and cleaning a semiconductor processing tool. In some implementations, one or more process blocks of FIG. 7 may be performed by an EUV system (e.g., EUV lithography system 100). In some implementations, one or more process blocks of FIG. 7 may be performed by another device or a group of devices separate from or including the EUV system, such as a controller (e.g., control device 217), a sensor (e.g., optical sensor 219, optical sensor 501, and/or pressure sensor(s) 259a, 259b, 259c, and/or 259d), a hydrogen nozzle (e.g., nozzle(s) 201a, 201b, 201c, 203a, 203b, 203c, 205a, 205b, 205c, 207a, 207b, and/or 207c), a movement mechanism (e.g., movement mechanism(s) 401a, 401b, 401c, 403a, 403b, 403c, 405a, 405b, 405c, 407a, 407b, and/or 407c), and/or a droplet generator head (e.g., droplet head 122). Additionally, or alternatively, one or more process blocks of FIG. 7 may be performed by one or more components of device 600, such as processor 620, memory 630, input component 640, output component 650, and/or communication component 660.

As shown in FIG. 7, process 700 may include receiving an indication of levels of tin contamination on a surface of an EUV tool (block 710). For example, the control device 217 may receive an indication of levels of tin contamination on a surface (e.g., collector 114) of the EUV tool 100, as described herein.

As further shown in FIG. 7, process 700 may include controlling, independently, flow rates associated with a first plurality of hydrogen outlets based on the indication (block 720). For example, the control device 217 may control, independently, flow rates associated with a first plurality of hydrogen outlets 201 and/or 207 based on the indication, as described herein. In some implementations, the first plurality of hydrogen outlets 201 and/or 207 are arrayed along a direction normal to the surface (e.g., collector 114).

Process 700 may include additional implementations, such as any single implementation or any combination of implementations described below and/or in connection with one or more other processes described elsewhere herein.

In a first implementation, process 700 further includes controlling (e.g., using the control device 217), independently, flow rates associated with a second plurality of hydrogen outlets 203 and/or 205 based on the indication. In some implementations, the second plurality of hydrogen outlets 203 and/or 205 are arrayed along the direction normal to the surface and spaced apart from the first plurality of hydrogen outlets along a direction that follows the surface.

In a second implementation, alone or in combination with the first implementation, process 700 further includes receiving (e.g., at the control device 217) an updated indication of levels of tin contamination on the surface, and adjusting (e.g., using the control device 217), independently, the flow rates associated with the first plurality of hydrogen outlets based on the updated indication.

In a third implementation, alone or in combination with one or more of the first and second implementations, the updated indication is received an amount of time after the indication is received, and the amount of time is in a range from approximately one minute to approximately one hour.

In a fourth implementation, alone or in combination with one or more of the first through third implementations, process 700 further includes providing (e.g., from the control device 217) a command to move a hydrogen outlet of the first plurality of hydrogen outlets based on the indication, where the first plurality of hydrogen outlets 201 and/or 207 are mounted with corresponding movement mechanisms 401 and/or 407.

In a fifth implementation, alone or in combination with one or more of the first through fourth implementations, process 700 further includes determining (e.g., using the control device 217) the flow rates associated with the first plurality of hydrogen outlets 201 and/or 207 based on the indication and using at least one machine learning model.

In a sixth implementation, alone or in combination with one or more of the first through fifth implementations, controlling the flow rates includes increasing a flow rate associated with one of the first plurality of hydrogen outlets, and decreasing a flow rate associated with another of the first plurality of hydrogen outlets.

In a seventh implementation, alone or in combination with one or more of the first through sixth implementations, process 700 further includes receiving (e.g., at the control device 217) an indication of locations of a plurality of tin droplets 505a and 505b in the EUV tool 100.

In an eighth implementation, alone or in combination with one or more of the first through seventh implementations, process 700 further includes controlling (e.g., using the control device 217), independently, flow rates associated with the first plurality of hydrogen outlets 201 and/or 207 based on the indication of locations of tin droplets.

In a ninth implementation, alone or in combination with one or more of the first through eighth implementations, process 700 further includes controlling (e.g., using the control device 217) insertion of a new tin droplet (e.g., from the droplet head 122) into the EUV tool 100 based on the indication of locations of tin droplets.

In a tenth implementation, alone or in combination with one or more of the first through ninth implementations, the indication of levels of tin contamination and the indication of locations of tin droplets are based on output from a same optical sensor.

In an eleventh implementation, alone or in combination with one or more of the first through tenth implementations, the indication of levels of tin contamination is based on output from a first sensor 219 and the indication of locations of tin droplets is based on output from a second sensor 501 different than the first sensor.

In a twelfth implementation, alone or in combination with one or more of the first through eleventh implementations, process 700 further includes determining (e.g., using the control device 217) the flow rates associated with the first plurality of hydrogen outlets 201 and/or 207 based on the indications and using at least one first machine learning model, and controlling (e.g., using the control device 217) insertion of a new tin droplet 551 into the EUV tool 100 based on the indications and using at least one second machine learning model.

In a thirteenth implementation, alone or in combination with one or more of the first through twelfth implementations, process 700 further includes receiving (e.g., at the control device 217) an updated indication of levels of tin contamination on the collector 114, receiving (e.g., at the control device 217) an updated indication of locations of the plurality of tin droplets 505a and 505b in the EUV tool 100, and adjusting (e.g., using the control device 217), independently, the flow rates associated with the first plurality of hydrogen outlets 201 and/or 207 based on the updated indications.

In a fourteenth implementation, alone or in combination with one or more of the first through thirteenth implementations, process 700 further includes updating a machine learning model using the flow rates associated with the first plurality of hydrogen outlets 201 and/or 207, the updated indication of levels of tin contamination on the collector 114, and the updated indication of locations of the plurality of tin droplets 505a and 505b in the EUV tool 100.

In a fifteenth implementation, alone or in combination with one or more of the first through fourteenth implementations, process 700 further includes forming (e.g., using a deposition tool), on a semiconductor substrate 110, a photoresist; receiving, at a wafer stage 136 of the EUV tool 100, the semiconductor substrate 110; generating (e.g., using the droplet head 122), within the EUV tool 100, a plurality of tin droplets 505a and 505b; generating, at a radiation source 102 of the EUV tool 100, EUV radiation; and exposing (e.g., using the POB 128) the semiconductor substrate 110 to the EUV radiation.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, a plurality of hydrogen outlets arrayed along a direction normal to a surface (such as a surface of a collector) of an EUV tool increase a volume of hydrogen gas surrounding the surface. As a result, airborne tin is more likely to be stopped by the hydrogen gas surrounding the surface and less likely to bind to the surface. Fewer tin deposits results in increased lifetime for the surface, which therefore reduces downtime for the EUV tool. Additionally, a control device may receive (e.g., from a camera and/or another type of sensor) an indication of levels of tin contamination on the surface and control flow rates to adjust a thickness of the hydrogen curtain. As a result, tin contamination on the surface is less likely to occur and will be more efficiently cleaned by the hydrogen gas, which results in further increased lifetime for the surface and reduced downtime for the EUV tool.

As described in greater detail above, some implementations described herein provide a method. The method includes receiving, at a control device, an indication of levels of tin contamination on a surface of an EUV tool. The method includes controlling, independently, flow rates associated with a first plurality of hydrogen outlets based on the indication, wherein the first plurality of hydrogen outlets are arrayed along a direction normal to the surface.

As described in greater detail above, some implementations described herein provide a system. The system includes a first plurality of hydrogen outlets that are arrayed along a direction normal to a surface of an EUV tool. The system includes a control device configured to receive an indication of levels of tin contamination on the surface and to control, independently, flow rates associated with the first plurality of hydrogen outlets based on the indication.

As described in greater detail above, some implementations described herein provide a method. The method includes forming, on a semiconductor substrate, a photoresist and receiving, at a wafer stage of an EUV tool, the semiconductor substrate. The method includes generating, within the EUV tool, a plurality of tin droplets. The method includes generating, at a radiation source of the EUV tool, EUV radiation and exposing the semiconductor substrate to the EUV radiation. The method includes receiving, at a control device, an indication of levels of tin contamination on a collector of an EUV tool. The method includes receiving, at the control device, an indication of locations of a plurality of tin droplets in the EUV tool. The method includes controlling, independently, flow rates associated with a first plurality of hydrogen outlets based on the indication of levels of tin contamination and the indication of locations of tin droplets, wherein the first plurality of hydrogen outlets are arrayed along a direction normal to the collector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving, at a control device, an indication of levels of tin contamination on a surface of an extreme ultraviolet (EUV) tool;
controlling, independently, flow rates associated with a first plurality of hydrogen outlets based on the indication, wherein the first plurality of hydrogen outlets are arrayed along a direction normal to the surface; and
controlling movement associated with a first hydrogen outlet of the first plurality of hydrogen outlets based on the indication using a first command provided to a first movement mechanism corresponding to the first hydrogen outlet.

2. The method of claim 1, further comprising:
controlling, independently, flow rates associated with a second plurality of hydrogen outlets based on the indication, wherein the second plurality of hydrogen outlets are arrayed along the direction normal to the surface and spaced apart from the first plurality of hydrogen outlets along a direction that follows the surface.

3. The method of claim 1, further comprising:
receiving, at the control device, an updated indication of levels of tin contamination on the surface; and
adjusting, independently, the flow rates associated with the first plurality of hydrogen outlets based on the updated indication.

4. The method of claim 3, wherein the updated indication is received an amount of time after the indication is received, and the amount of time is in a range from approximately one minute to approximately one hour.

5. The method of claim 1, further comprising:
determining the flow rates associated with the first plurality of hydrogen outlets based on the indication and using at least one machine learning model.

6. The method of claim 1, where controlling the flow rates comprises:
increasing a flow rate associated with one of the first plurality of hydrogen outlets; and
decreasing a flow rate associated with another of the first plurality of hydrogen outlets.

7. The method of claim 1, further comprising:
controlling, independent from movement of the first hydrogen outlet, movement associated with a second hydrogen outlet of the first plurality of hydrogen outlets based on the indication using a second command provided to a second movement mechanism corresponding to the second hydrogen outlet.

8. A system, comprising:
a first plurality of hydrogen outlets that are arrayed along a direction normal to a surface of an extreme ultraviolet (EUV) tool; and
a control device configured to:
receive an indication of levels of tin contamination on the surface,
control, independently, flow rates associated with the first plurality of hydrogen outlets based on the indication, and
control movement associated with a first hydrogen outlet of the first plurality of hydrogen outlets based on the indication using a first command provided to a first movement mechanism corresponding to the hydrogen outlet.

9. The system of claim 8, further comprising:
a second plurality of hydrogen outlets that are arrayed along the direction normal to the surface and spaced apart from the first plurality of hydrogen outlets along a direction that follows the surface,
wherein the control device is further configured to control, independently, flow rates associated with the second plurality of hydrogen outlets based on the indication.

10. The system of claim 8, further comprising:
at least one optical sensor configured to capture one or more images including the surface,
wherein the indication of levels of tin contamination is based on the one or more images.

11. The system of claim 10, wherein the control device is further configured to determine locations of a plurality of tin droplets in the EUV tool based on the one or more images.

12. The system of claim 8, further comprising:
at least one pressure sensor attached to the surface,
wherein the indication of levels of tin contamination is based on one or more measurements from the at least one pressure sensor.

13. The system of claim 8, wherein the control device is further configured to:
control, independent from movement of the first hydrogen outlet, movement associated with a second hydrogen outlet of the first plurality of hydrogen outlets based on the indication using a second command provided to a second movement mechanism corresponding to the second hydrogen outlet.

14. A method, comprising:
forming, on a semiconductor substrate, a photoresist;
receiving, at a wafer stage of an extreme ultraviolet (EUV) tool, the semiconductor substrate;
generating, within the EUV tool, a plurality of tin droplets;
generating, at a radiation source of the EUV tool, EUV radiation;
exposing the semiconductor substrate to the EUV radiation;
receiving, at a control device, an indication of levels of tin contamination on a collector of the EUV tool;
receiving, at the control device, an indication of locations of the plurality of tin droplets in the EUV tool; and
controlling movement associated with at least one of a first plurality of hydrogen outlets, based on the indication of levels of tin contamination and the indication of locations of tin droplets, using at least one command provided to at least one movement mechanism corresponding to the at least one of the first plurality of hydrogen outlets.

15. The method of claim 14, further comprising:
controlling insertion of a new tin droplet into the EUV tool based on the indication of locations of tin droplets.

16. The method of claim 14, wherein the indication of levels of tin contamination and the indication of locations of tin droplets are based on output from a same optical sensor.

17. The method of claim 14, wherein the indication of levels of tin contamination is based on output from a first sensor and the indication of locations of tin droplets is based on output from a second sensor different than the first sensor.

18. The method of claim 14, further comprising:
controlling flow rates associated with the first plurality of hydrogen outlets based on indication of levels of tin contamination and the indication of locations of tin droplets, wherein the first plurality of hydrogen outlets are arrayed along a direction normal to the collector.

19. The method of claim 18, further comprising:
receiving, at the control device, an updated indication of levels of tin contamination on the collector;
receiving, at the control device, an updated indication of locations of the plurality of tin droplets in the EUV tool; and
adjusting, independently, the flow rates associated with the first plurality of hydrogen outlets based on the updated indication of levels of tin contamination and the updated indication of locations of tin droplets.

20. The method of claim 19, further comprising:
updating a machine learning model using the flow rates associated with the first plurality of hydrogen outlets, the updated indication of levels of tin contamination on the collector, and the updated indication of locations of the plurality of tin droplets in the EUV tool.

\* \* \* \* \*